(12) United States Patent
Manson et al.

(10) Patent No.: US 8,032,152 B2
(45) Date of Patent: Oct. 4, 2011

(54) METHOD AND SYSTEM FOR CREATING A FLEXIBLE GIS DATA COLLECTION NETWORK

(75) Inventors: Paul Robin Manson, Christchurch (NZ); Bruce Stephen James, Christchurch (NZ); Michelle Lynn Bergen, Christchurch (NZ); Robert Murie Allan, Christchurch (NZ); John Francis Rogers, Christchurch (NZ); Peter Glen France, Christchurch (NZ)

(73) Assignee: Trimble Navigation Limited, Sunnyvale, CA (US)

( * ) Notice: Subject to any disclaimer, the term of this patent is extended or adjusted under 35 U.S.C. 154(b) by 996 days.

(21) Appl. No.: 11/788,662

(22) Filed: Apr. 19, 2007

(65) Prior Publication Data

US 2008/0262733 A1 Oct. 23, 2008

(51) Int. Cl.
*H04W 24/00* (2009.01)
*H04B 7/00* (2006.01)
*G06F 19/00* (2011.01)
*G01C 21/00* (2006.01)

(52) U.S. Cl. ............... 455/456.1; 455/457; 455/507; 455/521; 701/117; 701/118; 701/213

(58) Field of Classification Search ........... 455/456.1, 455/457, 507, 521; 701/117, 118, 213
See application file for complete search history.

(56) References Cited

U.S. PATENT DOCUMENTS

| 5,699,244 | A  | * | 12/1997 | Clark et al. ............... 701/213 |
| 6,662,193 | B1 | * | 12/2003 | Christensen ............... 707/621 |
| 6,766,361 | B1 |   | 7/2004 | Venigalla |
| 6,772,142 | B1 |   | 8/2004 | Kelling et al. |
| 6,898,516 | B2 | * | 5/2005 | Pechatnikov et al. ........ 701/202 |
| 7,283,975 | B2 |   | 10/2007 | Broughton |
| 7,720,703 | B1 |   | 5/2010 | Broughton |
| 2005/0014493 | A1 | * | 1/2005 | Ford ............................. 455/418 |
| 2006/0100816 | A1 |   | 5/2006 | Prentice et al. |
| 2006/0288014 | A1 |   | 12/2006 | Edwards et al. |

FOREIGN PATENT DOCUMENTS

| WO | WO-03/060712 | 7/2003 |
| WO | WO-03/067844 | 8/2003 |
| WO | WO-2004/104891 | 12/2004 |
| WO | WO-2004/114144 | 12/2004 |
| WO | WO-2005/048187 | 5/2005 |
| WO | WO-2007/005032 | 1/2007 |

OTHER PUBLICATIONS

Lu, Xiaolin "Develop Web GIS Based Intelligent Transportation Application Systems with Web Service Technology", ITS Telecommunications Proceedings, 2006 6th International Conference on, *IEEE*, (Jun. 1, 2006), 159-162.

(Continued)

*Primary Examiner* — Kamran Afshar
*Assistant Examiner* — Manpreet Matharu

(57) ABSTRACT

Embodiments of the present invention recite a method and system for creating a flexible Geographic Information Systems (GIS) network. In one embodiment, a data dictionary is assigned to a mobile electronic device. In one embodiment, the data dictionary comprises a definition of at least one desired GIS feature type which was not originally intended to be recordable by the mobile electronic device. The method further comprises uploading the data dictionary onto the mobile electronic device.

31 Claims, 18 Drawing Sheets

OTHER PUBLICATIONS

McCoy, John L., "GIS and Joint Use Management—A Productive Combination", Rural Electric Power Conference, 2005 San Antonio, TX *IEEE*, (May 8, 2005),C2-1.

Bandopadhyay, Subhansu et al., "Design of an Efficient Distributed GIS Application", *IEEE Tencon 2003*. Conference on Convergent Technologies for the Asia-Pacific Region. Bangalore, India., (Oct. 2003),1162-1166.

EPO. European Search Report Application No. EP 08007577, 8 pages, Dec. 4, 2008.

EPO, European Search Report Application No. EP 08007578, 8 pages, Dec. 4, 2008.

EPO, European Search Report Application No. EP 08007590, 8 pages, Dec. 4, 2008.

* cited by examiner

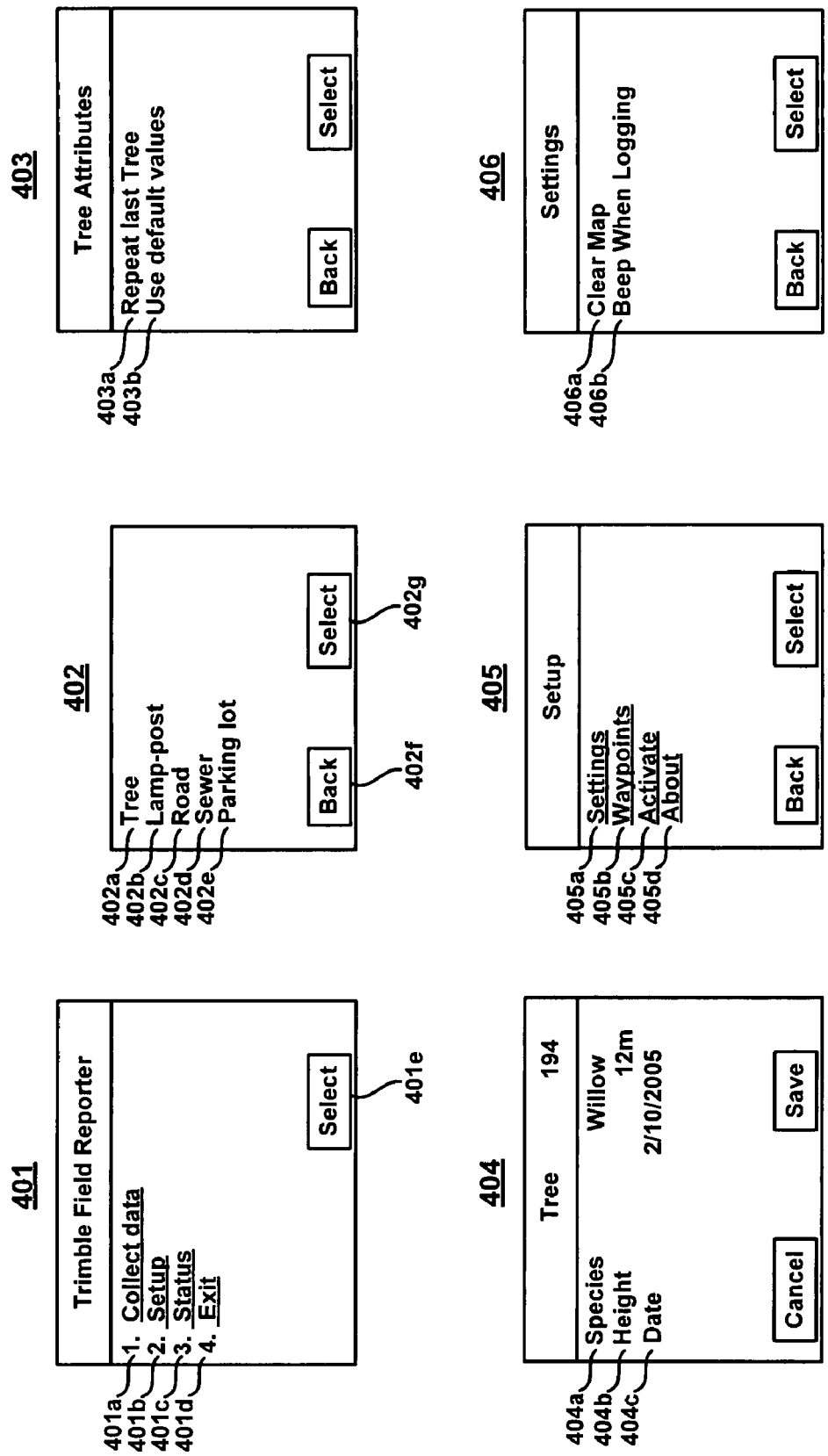

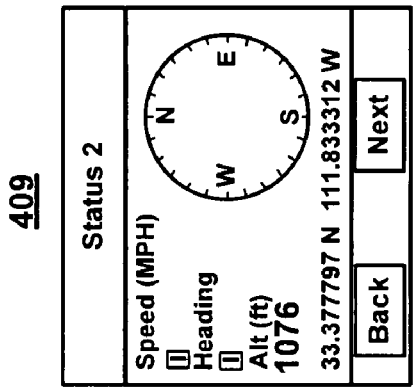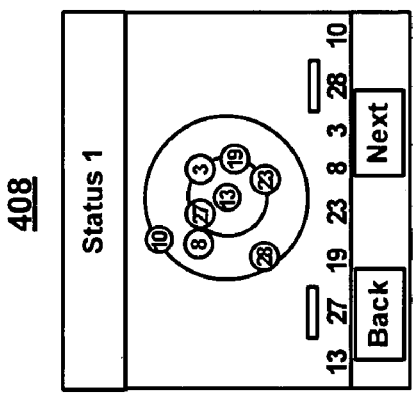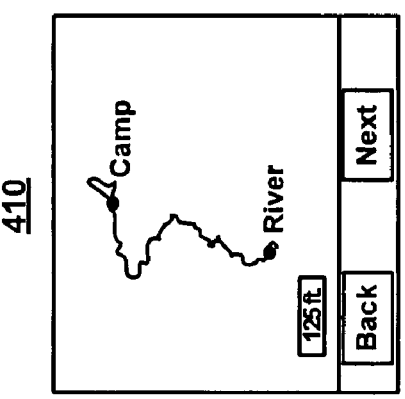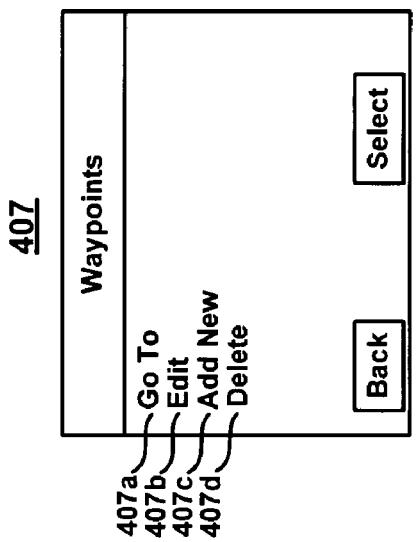
FIG. 4B

900

START
↓
DETERMINING AN ASSIGNED MEMBERSHIP OF A MOBILE ELECTRONIC DEVICE TO A WORKGROUP
901
↓
DETERMINING A DATA DICTIONARY RESIDENT UPON THE MOBILE ELECTRONIC DEVICE COMPRISING AT LEAST ONE GIS FEATURE WHICH IS SELECTED BASED UPON THE WORKGROUP
902
↓
RECEIVING A REQUEST FOR A SECOND DATA DICTIONARY COMPRISING AT LEAST ONE DESIRED GIS FEATURE WHICH WAS NOT ORIGINALLY INTENDED FOR THE WORKGROUP
903
↓
SENDING THE SECOND DATA DICTIONARY TO THE MOBILE ELECTRONIC DEVICE
904
↓
END

FIG. 9

1300
Project Related User Selectable Options
1310
 Worksites 1322
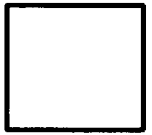 Assets 1324
FIG. 13A

1360
Selectable Options Level II
1360
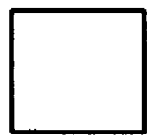 Sewers 1361
 Fire Hydrants 1362
 Water Meters 1363
FIG. 13B

1400

| Worksites 1322 ||
|---|---|
| Worksite 1410A | Worksite 1410B |
| Equipment 1411A | Equipment 1411B |
| Markers 1412A | Markers 1412B |

| Equipment 1410A | | |
|---|---|---|
| Asset 1450 | Location 1460 | Status 1470 |
| Grader 1450A | xxxxxxx 1460A | Flat Tire 1470A |
| Dozer 1450B | xxxxxxx 1460B | Due for Maint. 1470B |

FIG. 14B

METHOD AND SYSTEM FOR CREATING A FLEXIBLE GIS DATA COLLECTION NETWORK

FIELD OF THE INVENTION

Embodiments of the present invention are related to geo-spatial data collection networks.

BACKGROUND OF THE INVENTION

Geographic information systems (GIS) technology is increasingly used to provide geo-spatial data to a wide variety of business, government, and academic applications. GIS is often described as a collection of computer hardware, software, geographic data, and personnel which combine to record, store, process, interpret, and distribute geographically referenced data. GIS permit users to selectively interpret geo-spatial data in order to identify relationships, patterns, or trends that may not be readily discerned using traditional charts, graphs, or spreadsheets. Additionally, GIS can be used to anticipate future conditions based upon current and past data. As a result, GIS are increasingly used in asset management, event recording, resource planning, and demographic studies.

However, there are several factors which limit the use of GIS. One factor is the cost of deploying data collectors for GIS systems. Dedicated GIS data collectors are often large (e.g., up to 4-5 pounds) and expensive ($1500-$5000) per unit. Adding to the expense per-unit is the need for a console to which the recorded GIS data is downloaded. Many organizations use a dedicated personal computer (PC) for each deployed GIS data collector. The PC is needed in order to upload data dictionaries onto the GIS data collector which describe what data will be recorded that day and to download their recorded data at the end of the day. Additionally, at the end of the day, bottlenecks in downloading the collected data may occur if all of the users are at the office at the same time.

Another disadvantage of conventional dedicated GIS data collectors is that they often utilize a complicated user interface. Many GIS data collectors have dozens of input buttons for operators to learn and utilize an equally complicated user interface for navigating the data collector application. As a result, operators of conventional GIS data collectors require specialized training in order to fully realize the potential of these devices. Also, if the operators do not use the GIS data collector frequently, they can forget the functions associated with some of the buttons, or how to navigate the user interface.

As a result of the above stated problems, entities which utilize GIS data collection systems are often limited in the number of GIS data collectors they can deploy in the field. As a result, collection of data which is reasonably current may be constrained by the cost of collecting it. Whether it is due to the cost of the data collectors themselves, the additional equipment needed to support the deployment of the data collectors, or the cost of training operators, the ability to collect geo-spatial data in a timely manner is limited to a small percentage of the available workforce.

SUMMARY OF THE INVENTION

Embodiments of the present invention recite a method and system for creating a flexible Geographic Information Systems (GIS) network. In one embodiment, a data dictionary is assigned to a mobile electronic device. In one embodiment, the data dictionary comprises a definition of at least one desired GIS feature type which was not originally intended to be recordable by the mobile electronic device. The method further comprises uploading the data dictionary onto the mobile electronic device.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

FIGS. 4A and 4B show exemplary screens displayed by a user interface in accordance with embodiments of the present invention.

FIG. 9 is a flowchart of another method for creating a flexible GIS network in accordance with embodiments of the present invention.

FIG. 13A is an exemplary block diagram of a listing of top level user selectable options in accordance with embodiments of the present invention.

FIG. 13B is an exemplary block diagram of a listing of sub-level user selectable options in accordance with embodiments of the present invention.

FIG. 14A is an exemplary block diagram of a top level user-defined GUI dashboard in accordance with embodiments of the present invention.

FIG. 14B is an exemplary block diagram of a second level user-defined GUI dashboard in accordance with embodiments of the present invention.

DETAILED DESCRIPTION OF THE PREFERRED EMBODIMENT

Figure 1:
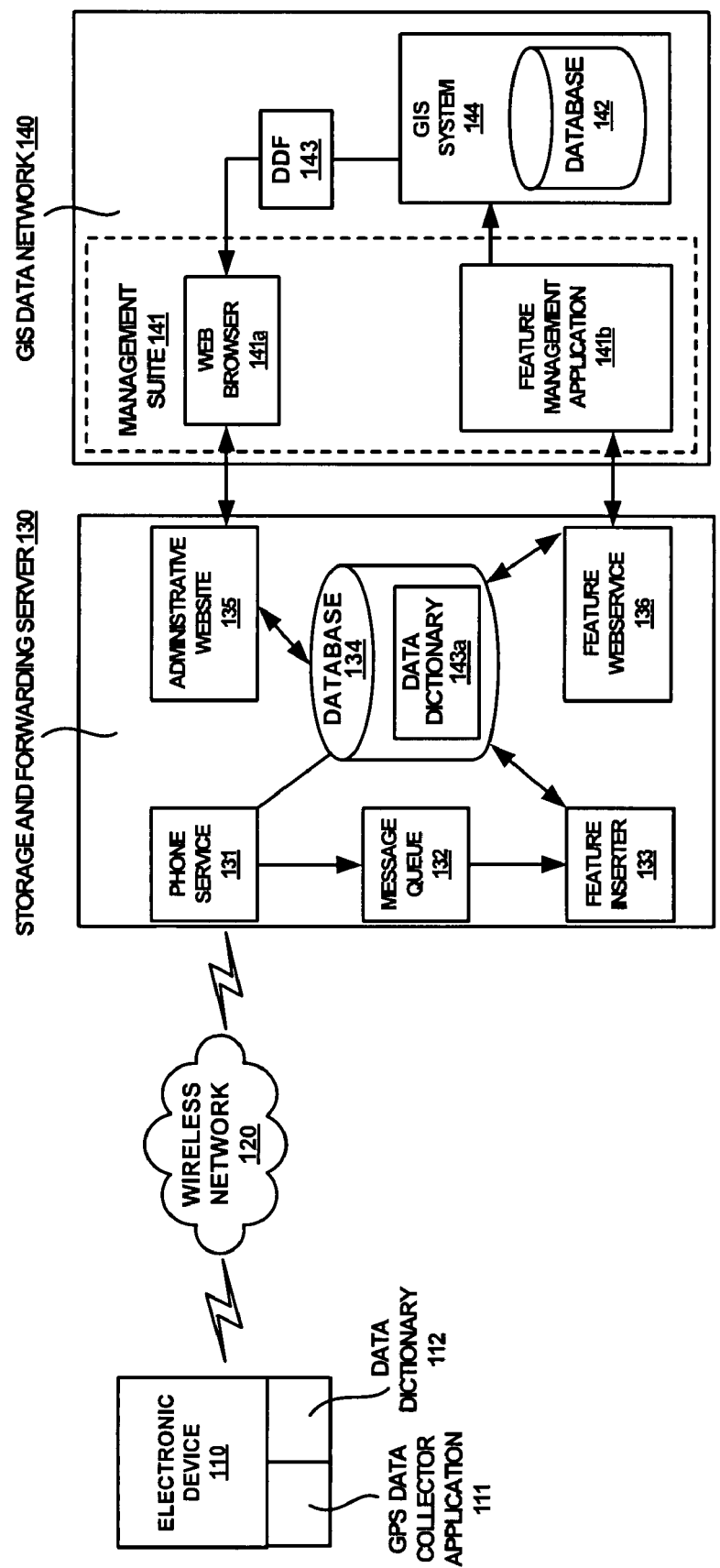
FIG. 1 shows a system used for creating a GIS data collection network in accordance with embodiments of the present invention.

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "assigning," "uploading," "downloading," "using," "conveying," "determining," "forwarding," "storing," "establishing," "initiating," "sending," "generating," "deleting" "utilizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Section I

Introduction

In order to more clearly describe embodiments of the present method and system for creating a GIS data collection network in accordance with embodiments of the present invention, a general system overview will be presented below in Section II. This is followed by a discussion of data dictionaries in Section III, legacy handheld devices in Section IV, and a GIS data collector application in accordance with embodiments of the present invention in Section V. In Section VI, a storage and forwarding server in accordance with embodiments of the present invention is discussed. Additionally, in Section VII, a GIS management application in accordance with embodiments of the present invention is discussed. In Section VII, delivery of tailored information to a device in accordance with embodiments of the present invention is discussed.

Section II

General System Overview

FIG. 1 shows a system 100 used for creating a GIS data collection network in accordance with embodiments of the present invention. With reference to FIG. 1, a mobile electronic device 110 is communicatively coupled with a wireless network 120. Wireless network 120 is also communicatively coupled with a GIS data network 140 via a storage and forwarding server 130.

In embodiments of the present invention, mobile electronic device 110 may be a cellular telephone, personal digital assistant (PDA), a mobile computer system, or the like. As will be discussed in greater detail below, in embodiments of the present invention, mobile electronic device 110 is capable of determining its geographic position in at least two dimensions (e.g., latitude and longitude), or more (e.g., height, time, etc.). Significantly, in embodiments of the present invention, mobile electronic device 110 is a legacy mobile electronic device. For the purposes of the present invention, a "legacy mobile electronic device" is defined as an original equipment manufacturer (OEM) device which is not specifically designed or manufactured to be used solely as a GIS data recording device. However, embodiments of the present invention may also be implemented with dedicated OEM GIS data recording devices as well.

In embodiments of the present invention, a GIS data collector application 111 is uploaded into mobile electronic device 110 which then enables mobile electronic device 110 to perform GIS data collector functions. Also uploaded onto mobile electronic device 110 is a data dictionary 112. In embodiments of the present invention, data dictionary 112 is a subset of a larger data dictionary which is managed by GIS data network 140. As will be explained in greater detail in Section III below, a data dictionary comprises definitions of feature types having measurable attributes as well as information on how those attributes should be collected. For example, information on how the attributes should be collected may include, but are not limited to, default values, minimum/maximum values, whether an attribute is optional or mandatory, etc. In embodiments of the present invention, the attributes and feature types comprising data dictionary 112 are selected at GIS data network 140 and stored upon storage and forwarding server 130 as data dictionary 143a. When communications are first established between mobile electronic device 110 and storage and forwarding server 130, a copy of data dictionary 143a is automatically sent to mobile electronic device 110 where it is stored as data dictionary 112. Thus, in embodiments of the present invention, data dictionary 112 will typically be sent to mobile electronic device 110 once, with occasional updates as needed. However, embodiments of the present invention also facilitate sending entirely new, or additional, data dictionaries to mobile electronic device 110 as well.

Storage and forwarding server 130 is used to store and upload data dictionaries (e.g., data dictionary 112) as well as configuration and management settings such as workgroups which are received via administrative website 135. In another embodiment, this role may be performed by, for example, a management suite (e.g., management suite 141 of FIG. 1). Storage and forwarding server 130 is further configured to download and store collected GIS features, and attributes thereof, from mobile electronic device 110. Additionally, storage and forwarding server 130 is configured to forward the collected GIS features and attributes in response to a request for that data from GIS data network 140. Storage and forwarding server 130 may also be configured to perform post-processing of collected GIS data such as weighted averaging of position data, rejection of outlier values (e.g., position fixes), dropping intermediary position fixes between two end-points, etc. In embodiments of the present invention, storage and forwarding server 130 is operated by a provider of a hosting service. In another embodiment, storage and forwarding server 130 may be integrated as a component of GIS data network 140. In embodiments of the present invention, mobile electronic device 110 is remotely located from storage and forwarding server 130 and GIS data collector application 111 and/or data dictionary 112 are uploaded from storage and forwarding server 130 to mobile electronic device 110 via wireless network 120.

GIS data network 140 is configured to receive the collected GIS features and attributes from deployed mobile devices such as mobile electronic device 110. In the present embodiment, GIS data network 141 comprises a management suite 141, which further comprises web browser 141a and a feature management application 141b. GIS data network 140 further comprises a GIS computer system 144 comprising, in the present embodiment, a database 142. It is appreciated that in embodiments of the present invention, database 142 may be a separate component from GIS computer system 144. In embodiments of the present invention, an administrator of GIS data network 140 utilizes web browser 141a to access administrative website 135 of storage and forwarding server 130. The administrator can then configure and manage the account registered to GIS data network 140. This may include, but is not limited to registering and managing the mobile electronic device(s) 110 which are deployed, managing data dictionaries, and managing collected GIS data. In embodiments of the present invention, configuring and managing mobile electronic device 110 may include, but is not limited to, registering mobile electronic device 110 with an operator of wireless network 120 (e.g., creating an account), assigning mobile electronic device 110 to a user, and assigning mobile electronic device 110 to at least one workgroup. In embodiments of the present invention, data dictionary management may include, but is not limited to, creating and editing data dictionaries and assigning a data dictionary to a workgroup.

In embodiments of the present invention, wireless network 120 is a cellular telephone network. However, embodiments of the present invention are well suited to utilizing wired networks, or other types of wireless networks as well such as a wireless local area network (LAN), or Internet connection rather than a cellular telephone network.

Operation of the GIS System

An exemplary description of the operation of system 100 follows. It is noted that greater detail of the specific components of system 100 are covered in the sections following below. It is further noted that in the following discussion, mobile electronic device 110 will be referred to as a cellular telephone.

Often, entities such as businesses or government agencies issue cellular telephones to their employees. With reference to FIG. 1, in such an embodiment mobile electronic device 110 is comprised of a cellular telephone provided by an entity to one of its employees. In one embodiment, GIS data network 140 initiates creating an account for GIS data network 140 with storage and forwarding server 130. Storage and forwarding server 130 then creates the account and sends a message to GIS data network 140 informing them that the account has been created. In one embodiment, GIS data network 140 then registers mobile electronic device 110 with their account. It is noted that the registration of mobile electronic device 110 may be performed during the account creation step.

In one embodiment, when registering mobile electronic device 110, an administrator uses administrative website 135 to enter configuration information about mobile electronic device 110. This information may include, but is not limited to, the employee name, the telephone number associated with mobile electronic device 110, and at least one workgroup to which the employee, and thus also mobile electronic device 110, is associated. In embodiments of the present invention, this configuration information is stored in database 134 of storage and forwarding server 130. However, the configuration information may also be stored in database 142 of GIS data network 140, or another networked storage device, in embodiments of the present invention. The administrator will then download a data dictionary onto database 134 of storage and forwarding server 130. Using web browser 141a, the administrator can select GIS attributes and feature types to create data dictionaries (e.g., data dictionary 143a) which are subsets of the entire data dictionary which was downloaded onto database 134. The administrator will also assign a data dictionary (e.g., 143a) to the worker. The data dictionary is to be uploaded onto mobile electronic device 110. In embodiments of the present invention, the selection of which data dictionary may be based upon which workgroup the employee is assigned. In other words, all employees in a particular workgroup are assigned the same data dictionary. Alternatively, the selection of a data dictionary may be based upon other criteria. For example, an employee may call the administrator and request a different data dictionary based upon events or conditions in the field. Thus, a workgroup may consist of one person in embodiments of the present invention.

When an employee wants to record GIS data, GIS data collector application 111 automatically contacts storage and forwarding server 130 via wireless network 120. Upon initially establishing communications with mobile electronic device 110, storage and forwarding server 130 automatically uploads the data dictionary (e.g., 112) appropriate for that mobile electronic device 110 based upon the workgroup to which mobile electronic device 110 is assigned. In embodiments of the present invention, if the administrator of GIS data network 140 modifies data dictionary 143a, storage and forwarding server 130 will automatically update the data dictionary 112 resident on mobile electronic device 110. In embodiments of the present invention, this may occur while mobile electronic device 110 is still communicatively coupled with storage and forwarding server 130, or when communications are next established between mobile electronic device 110 and storage and forwarding server 130.

In embodiments of the present invention, when attributes and/or other data about a feature are recorded by mobile electronic device 110, they are automatically forwarded to storage and forwarding server 130. If, for some reason, communications between mobile electronic device 110 and storage and forwarding server are not yet established, or interrupted, when the GIS data is being recorded, the data will be stored upon mobile electronic device 110. When communications are later established with storage and forwarding server 130, the data will be automatically forwarded from mobile electronic device 110 to storage and forwarding server 130. In embodiments of the present invention, when the GIS data is successfully stored in database 134 of storage and forwarding server 130, a message is sent to mobile electronic device 110 which confirms that the data has been successfully stored. In response to this message, the recorded GIS data which was successfully stored on database 134 is erased from mobile electronic device 110. In embodiments of the present invention, erasing this data from mobile electronic device 110 is performed automatically in response to receiving the confirmation message from storage and forwarding server 130. Thus, the user of mobile electronic device 110 does not have to manage the collected data. In another embodiment, the GIS data resident on mobile electronic device 110 may be marked as transferred and stored on mobile electronic device 110 for future reference, or for drawing a map. In one embodiment, if the memory of mobile electronic device 110 becomes full, GIS data which has been marked as transferred can be automatically deleted to make room for additional data.

In the present embodiment, the administrator of GIS data network 140 may configure management application 141 to periodically poll storage and forwarding server 130 to determine if new data is available. Thus, depending upon the polling interval set by the administrator of GIS data network 140, the GIS data collected by mobile electronic device 110 may become available to GIS data network 140 in near real-time. In another embodiment of the present invention, when the GIS data from mobile electronic device 110 has been stored on database 134 of storage and forwarding server 130, a message may be sent to GIS data network 140 notifying the administrator that new GIS data is available. In embodiments of the present invention, this message may include information such as which device has collected the information. In one embodiment, these messages are sent to GIS data network 140 periodically throughout the day if new GIS data is available.

In embodiments of the present invention, upon successfully storing the GIS data collected by mobile electronic device 110, a confirmation message is sent by management application 141 to storage and forwarding server 130. In response to this message, the GIS data collected by mobile electronic device 110 is archived for future retrieval if necessary. Alternatively, the GIS data collected by mobile electronic device 110 may be deleted from database 134 of storage and forwarding server 130 in response to the message.

Embodiments of the present invention are advantageous over conventional GIS data collection methods, because by reducing the cost and complexity of owning and operating the GIS data collectors, embodiments of the present invention facilitate using far greater numbers of employees in the field as GIS data collection operators. Embodiments of the present invention comprise uploading an application which makes a mobile electronic device such as, for example, a cellular telephone operable to use as a GIS data collector. As a result, the hardware cost is substantially reduced from that of a conventional dedicated GIS data collector (e.g., thousands of dollars) to the cost of a cellular telephone (e.g., hundreds of dollars or less). Additionally, because GIS data collector application 111, incorporates display and input methods that are consistent with the other applications and functions already used by mobile electronic device 110, the user can perform GIS data collection functions without the need for extensive training. In other words, a user will more readily understand how to utilize of mobile electronic device 110 as a GIS data collection device because the user is already familiar with the display and input methods used by mobile electronic device 110. Additionally, because the collected GIS data is automatically sent to storage and forwarding server 130, the user does not have to worry about manipulating the data or downloading it at the end of the day. An additional advantage of automatically sending the collected data to storage and forwarding server 130 is that the collected data can be accessed by GIS data network 140 in near real-time.

Additionally, embodiments of the present invention do not require a dedicated PC for each deployed data collection device, thus reducing the cost associated with operating a GIS data collection network. In conventional GIS data collection networks, each worker using a dedicated GIS data collector typically needs their own PC as a terminal to upload data dictionaries and to download collected GIS data. In embodiments of the present invention, this is not necessary because the data dictionaries are automatically uploaded via wireless network 120 upon establishing communications with storage and forwarding server 130, and because the GIS data is automatically sent to storage and forwarding server 130 via wireless network 120 when it is recorded.

Also, because the data is erased from mobile electronic device 110 after it has been successfully stored by storage and forwarding server 130, memory and computational resources of mobile electronic device 110 are available for other purposes. This also enhances the security of the collected data as it cannot be recovered from a lost or stolen mobile electronic device once it is erased.

Additional advantages of embodiments of the present invention are that the data dictionaries are assigned by the administrator of GIS data network 140, and that the data dictionaries can be sent automatically to remotely located mobile electronic devices 110. As described above, an administrator of GIS data network 140 can assign a worker's cellular telephone, for example, to one or more workgroups. In embodiments of the present invention, the administrator also can assign a particular data dictionary to a selected workgroup. This information is stored in database 134 of storage and forwarding server 130. Thus, the data dictionaries for a given workgroup can be automatically and uniformly updated by the administrator without the requirement that the operators of the mobile electronic devices are all simultaneously connected to the network.

As an example, all of the employees of a utility company may be issued mobile electronic devices 110, for example cellular telephones, and tasked with recording attributes of utility poles in a given area in addition to their normal assigned duties. Thus, the data dictionaries assigned to all of these employees would be specific to recording data about utility poles. Because of the reduced cost of using cellular telephones as GIS data recording devices, more GIS data collectors can be deployed, and at a lower cost, than is possible using conventional GIS data collectors. If one of the employees sees an event which should be reported, the employee can contact the administrator of GIS data network 140 and request a different data dictionary, or a modification of the existing data dictionary, in order to record that event. For example, if one of the members of a pole repair crew notices some tree branches which are dangerously close to some power lines, that employee can request a new or modified data dictionary which will allow reporting the dangerous tree condition to GIS data network 140. The administrator of GIS data network 140 will modify the data dictionary of the workgroup to which mobile electronic device 110 is assigned and forward that information to storage and forwarding server 130. Alternatively, if the administrator of GIS data network 140 decides that the pole repair crews should also be able to report tree branch problems, the administrator can change the data dictionary (e.g., 112) assigned to the pole repair workgroup. The data dictionaries for each member of the pole repair workgroup will then be automatically updated the next time they establish communications with storage and forwarding server 130.

Upon receiving the modified data dictionary, storage and forwarding server 130 can automatically update the data dictionary for the employee's mobile electronic device 110 so that the user can now record attributes about the dangerous tree condition. When the employee records the attribute data, the feature/attribute data is automatically sent to storage and forwarding server 130 and stored in database 134. The stored attribute data is, in turn, forwarded to GIS data network 140 as described above.

An additional advantage of the present invention is that this can occur outside the normal working hours of the employee using mobile electronic device 110. For example, the employee may notice the tree branches while headed home from work or on his/her weekend. In a conventional GIS data collection network, the employee would not be able to record the feature and attribute data needed to report the tree branches to GIS data network 140 because the GIS data recorders would normally be stored at the employee's workplace. This is because conventional GIS data recorders are expensive assets which most corporate and government entities want securely stored when not in use. However, many of these same entities routinely issue mobile electronic devices 110, such as cellular telephones for example, to their employees which the employees carry home with them outside of their normal working hours. In the above scenario, the employee noticing the tree branches would probably record the location of the tree on a piece of paper which could possibly get lost or forgotten by the employee. However, using embodiments of the present invention, the data can be quickly and safely recorded and forwarded to GIS data network 140 in a reliable and near real-time fashion.

An additional advantage of embodiments of the present invention is that, once GIS data collector application 111 is uploaded onto mobile electronic device 110, the necessity for extensive training to utilize a GIS data collector is reduced. This is in part due to the fact that data dictionary 112 comprises a subset of a more comprehensive GIS data dictionary in order to simplify the use of GIS data collector application 111. Thus, the need for extensive training typically provided to dedicated GIS data collection professionals is not necessary using embodiments of the present invention and data collection may be performed by, for example, field workers whose primary task is usually not data collection. It is noted that embodiments of the present invention may be utilized to send a data dictionary, or an updated GIS data collector application, to a dedicated GIS data collector as well.

As will be described in greater detail below, the administrator of GIS data network 140 selects the features which will be recorded by an employee or workgroup. The administrator then creates a data dictionary 112 which facilitates recording that data and forwards that information to storage and forwarding server 130. Because the data dictionary has been simplified, a simpler user interface and data input device can be used to record the GIS data. As a result, field workers whose primary duties do not normally include data collection can be quickly trained to use the simplified user interface of the present invention. In embodiments of the present invention, this may be accomplished using, for example, a legacy cellular telephone, PDA, or other mobile electronic device 110 which was not originally designed for use as a GIS data collector. Conventional GIS data recorders typically utilize an extensive data input array which necessitates extensive operator training in order to fully utilize the functions of the data collector. However, embodiments of the present invention facilitate displaying a simplified user interface on mobile electronic device 110 (e.g., a cellular telephone, PDA, laptop computer, etc.) which is familiar to the operator of the device and which is mapped to the existing user input device of the mobile electronic device 110. As a result, the user interface of the GIS data collector application in embodiments of the present invention is more easily navigated than conventional GIS data collector user interfaces and does not require the extensive training needed to effectively operate the user input device. Because the recorded GIS data is automatically forwarded from mobile electronic device 110 (e.g., a cellular telephone) to storage and forwarding server 130, the need for the operator to manage the recorded data on the mobile electronic device is eliminated.

Section III

Data Dictionaries

The following discussion is intended to define the term "data dictionary" and to clarify how they are used in accordance with embodiments of the present invention. For the purposes of the present invention a "data dictionary" is defined as a structured description of feature types, and/or definitions thereof, as well as associated attributes relevant to a particular project, plus information on how those attributes should be collected. The feature types listed in a data dictionary are objects such as trees, utility poles, fire hydrants, roads, lakes, etc., while the attributes describe the feature. GIS features include geometry which may be defined as a point (e.g., a power pole site, a tree site, a fire hydrant site, etc.), a line (e.g., a road, a stream, a pipeline, etc.), or a polygon or area (e.g., a park, a housing lot, a farm field, etc.). The attributes of an object are pieces of descriptive information which describe the object. Thus, the attributes of a tree may include its height, girth, species, location, condition (e.g., healthy, dead, overturned, etc.). As another example, a data dictionary in which the features being recorded are road signs might list attributes such as location, type of sign (e.g., Stop, Yield, No Parking, etc.), time, date, condition of sign (e.g., is the sign readable or in need of replacement), etc. The data dictionary also includes information about how attributes should be collected. This may include default values, minimum/maximum values, and can specify whether each attribute is optional or mandatory.

The data dictionary does not in itself contain information, but instead structures and limits how data is recorded to ensure data integrity and uniformity. Typically, an attribute can be one of six different types. One type is a numeric format which is used when the range of possible values of the attribute is a set of decimal or whole numbers. For example, a numeric format would be used in recording the height of a tree. When creating a data dictionary, the administrator of GIS data network 140 may specify how numeric data is entered by GIS data collector application 111. In embodiments of the present invention, this may include, but is not limited to, specifying the precision of the numeric attribute (e.g., the number of decimal places used), the minimum and maximum allowable values, and an optional default value.

A text format is used when the attribute is to be described using a string of characters. For example, the name of a street on which a tree is located may be entered as a text string. When creating a data dictionary, the administrator of GIS data network 140 may also specify how text data is entered by GIS data collector application 111. In embodiments of the present invention, this may include, but is not limited to, specifying a maximum length of the text string, or an optional default value of the text string.

A date format is used when the value being recorded is the date. In the present example, this may be the date that the tree attributes are being recorded. When creating a data dictionary, the administrator of GIS data network 140 may also specify how the date is entered by GIS data collector application 111. In embodiments of the present invention, this may include, but is not limited to, specifying a format for recording the date (e.g., dd/mm/yyyy, etc.).

A time format is used when the value being recorded is the current time. In the present example, this may be the time that the tree attributes are being recorded. When creating a data dictionary, the administrator of GIS data network 140 may also specify how the time is entered by GIS data collector application 111. In embodiments of the present invention, this may include, but is not limited to, specifying a format for recording the current time (e.g., 24-hour clock, GMT, etc.).

A menu is used when the possible domain of an attribute is a definable set of values. For example, the domain of the attribute species for the feature tree may comprise maple, oak, sycamore, pine, etc. When creating a data dictionary, the administrator of GIS data network 140 may also specify the set of values displayed in a menu associated with a feature.

A file attribute is used to link features and attributes being collected to existing files on a computer. In the present example, this may be an image file of the tree being recorded.

Data dictionaries are advantageous because they can structure the data collection process. By limiting what features can be recorded, as well as limiting the attributes of those features, data dictionaries can ensure that only relevant data is recorded. For example, by defining the values of an attribute (e.g., by using a menu format) the administrator can ensure that only the desired information is recorded by a user. Additionally, the data dictionary can ensure that all required information is collected before saving or forwarding the data to storage and forwarding server 130. For example, a user attempting to save recorded data may see a message displayed informing him/her that additional attributes must be recorded prior to saving the data.

Data Dictionary Creation

In embodiments of the present invention, data dictionaries for mobile electronic device 110 are created by the administrator of GIS data network 140. As will be discussed in greater detail in Section VII below, administrators can use administrative website 135 to import an existing data dictionary file (e.g., DDF 143 of FIG. 1) onto database 134 of storage and forwarding server 130 where it is stored as data dictionary 143a. DDF 143 and data dictionary 143a can be described as a complete set of feature types from which subsets of feature types are selected and used as data dictionaries for workgroups, or mobile electronic devices (e.g., 110). Once the import is complete, the administrator can use management application 141 to select mobile electronic devices and associate them in a workgroup.

The administrator then creates a data dictionary whose feature types are selected from data dictionary 143a according to the workgroup to which the data will be assigned. For example, in embodiments of the present invention, when initially configuring the account with storage and forwarding server 130 the administrator can use administrative website 135 to identify a particular workgroup and select a set of feature types for the data dictionary of that workgroup. This information is then stored by storage and forwarding server 130. When a mobile electronic device assigned to that workgroup contacts storage and forwarding server 130, the data dictionary 112 is forwarded to the device. For example, in one embodiment, storage and forwarding server 130 automatically uploads the data dictionary onto the mobile electronic device if it determines that the mobile electronic device does not currently have a data dictionary stored thereon, or if the data dictionary stored on mobile electronic device 110 is out of date.

Thus, the selection of feature types is performed by the administrator of GIS data network 140 and is uniform for all of the mobile electronic devices assigned to a particular workgroup. Furthermore, the forwarding of the data dictionaries is automatic upon establishing communications between storage and forwarding server 130 and the mobile electronic devices assigned to the workgroup. Most significantly, this can be performed while the data collecting device (e.g., 110) is deployed at a site and does not require a dedicated workstation. The selection of attributes and feature types, as well as the uploading of data dictionary 112 onto mobile electronic device 110, is transparent to the employee. Thus, the need for extensive training in the use of a GIS data collector, as well as the management of data dictionaries and collected data, is reduced. As a result, an employee, whose primary duty is not as a GIS data collector, can collect and report GIS data as the need arises.

Data Dictionary Editing

In embodiments of the present invention, the administrator of GIS data network 140 can edit the data dictionaries which are resident upon storage and forwarding server 130. This can include adding or deleting features and/or attributes thereof from existing data dictionaries, or creating new feature types and/or attributes thereof which did not previously exist. In embodiments of the present invention, when the administrator edits or modifies a data dictionary for a workgroup, storage and forwarding server 130 saves these changes and creates a new version of the data dictionary for that workgroup. Storage and forwarding server 130 will then forward the new version of the data dictionary to the mobile electronic devices that are assigned to that workgroup.

As an example, when a mobile electronic device establishes communications, storage and forwarding server 130 determines the version of the data dictionary stored by the mobile electronic device. If the mobile electronic device is using an older version of the data dictionary, storage and forwarding server 130 automatically updates the data dictionary for that device. Again, this promotes uniformity in the definitions of feature types and attributes collected by devices in a particular workgroup. Furthermore, because this is performed automatically as soon as a device connects with storage and forwarding server 130, embodiments of the present invention may prevent the collection of GIS data using an out of date data dictionary.

Creation of a Flexible GIS Data Collection Workforce

Embodiments of the present invention facilitate the creation of flexible GIS data collection workforces which may be useful during, for example, natural disasters and civil emergencies. This is possible because the data dictionaries can be quickly modified according to any priority identified by the administrator of GIS data network 140. The administrator of GIS data network 140 can simply modify the data dictionaries of one or more of the workgroups so that the data dictionaries are directed to a different set of feature/attribute data according to current needs. The modified data dictionary information is stored upon storage and forwarding server 130 and uploaded to the mobile electronic devices assigned to the workgroup(s) identified by the administrator. Thus, if a variety of workgroups were each recording different types of features, they could be reconfigured to all report a single type of feature based upon receiving a modified data dictionary from storage and forwarding server 130.

As an example, a utility company can reconfigure the data collected by their workforce in response to a severe storm, tornado, or hurricane. Assuming a first workgroup uses a data dictionary which is directed toward recording data about utility poles, a second workgroup uses a data dictionary which is directed toward recording data about buried electric lines, and a third workgroup uses a data dictionary which is directed toward recording data about natural gas lines. In the wake of a major storm, large numbers of power lines may be knocked down by high winds and fallen branches. Using embodiments of the present invention, the administrator of GIS data network 140 can reconfigure the data dictionaries of all three workgroups so that they are all directed toward recording data about downed power lines.

The administrator could then, for example, send a text message to all workgroups telling them to collect data about downed power lines using a new data dictionary which is now available. In one embodiment, the new or modified data dictionary is automatically uploaded onto mobile electronic device 110, but is not used if feature/attribute data is currently being collected by mobile electronic device 110. In another embodiment, the user may need to re-establish communications with storage and forwarding server 130 prior to uploading the new or modified data dictionary 112 onto mobile electronic device 110. Upon re-establishing communications with storage and forwarding server 130 each of the mobile electronic devices will receive the modified data dictionary. Alternatively, an employee in the field may witness an event which requires a new data dictionary to report properly. The employee can call the administrator of GIS data network 140 and report what has occurred and request a new data dictionary. The administrator can then modify the data dictionary for that worker's workgroup so that the event can be properly recorded to storage and forwarding server 130 and, ultimately, to GIS data network 140. It is again noted that the administrator of GIS data network 140 may create a workgroup consisting entirely of the employee reporting the event in order to modify the data dictionary of that employee only. It is noted that the new or modified data dictionary 112 comprises features and/or attributes which were not originally intended for use by mobile electronic device 110 when it was issued to the employee.

In another example, the same three workgroups could be directed to spotting outbreaks of forest fires or grass fires during dry seasons in support of the fire department. The three workgroups could also be used to report instances of flooding during a storm or levee break, or instances of medical emergency in a terrorist attack, earthquake, or industrial accident.

As the employees begin recording the new feature/attribute data, it is automatically sent to storage and forwarding server 130. In one embodiment, GIS data network may set a polling interval so that the data is received by GIS data network 140 in near real-time. In another embodiment, storage and forwarding server 130 may be configured to forward the collected feature/attribute data to GIS data network 140 in real-time (e.g., as soon as it is stored upon database 134). Additionally, because an electronic record is being sent, the data is conveyed more quickly and reliably than if an employee in the field was calling in the reports or using a pen and paper to record the data.

In some instances, feature management application 141*b* may retrieve features from feature webservice 136 which utilize different versions of a data dictionary (e.g., due to updating the data dictionary for a workgroup). In embodiments of the present invention, feature management application 141*b* can retrieve the appropriate version of a data dictionary associated with features it retrieves from feature webservice 136. The retrieved data dictionary can then be used to validate the features it receives against the appropriate version of the data dictionary used to collect the data. Feature management application can also perform any transformations of feature data from the old version to the new version of the data dictionary before storing them into database 142.

Because of the reduced cost associated with using embodiments of the present invention, a larger group of data collectors can be deployed in an emergency than is possible using conventional dedicated GIS data collectors which limit the number of deployed data collectors due to the cost of the devices themselves and the training to use them. Additionally, the changes to data dictionaries can be made while the employees are deployed in the emergency area which improves the response time for the utility company. In a conventional GIS data collection environment, the requirement that the employees in the workgroups return to their data terminals to download the modified data dictionaries can considerably increase the response time, especially if the roads are blocked. Thus, embodiments of the present invention facilitate the creation of a flexible GIS workforce which can be rapidly reconfigured to respond to changing conditions, emergencies, disasters, etc.

Construction-Specific Data Dictionaries

In embodiments of the present invention, data dictionary 112 may be configured by the administrator of GIS data network 140 such that it is tailored for use in reporting data from construction sites. For example, data dictionary 112 may be configured with features which may be recorded by a user of electronic device 110 which include, but are not limited to:

Job site name and location; (Specific location, reference point, actual point)
Job site ID;
Job foreman;
Data recorder (e.g., the operator of electronic device 110);
Date;
Tasks being performed today, this week, this month;
Status of each task;
Machine(s) performing each task;
Operator assigned to each machine;
Machine status;
Special needs for each machine, if any
Special needs for a specific task;
Reason for the non-performance of a task (e.g., weather, illness, road hazard, strike, customer work stop order, contract dispute, lack of funds, etc.);
Expected remedy;
Expected re-start date.

Furthermore, the administrator of GIS data network 140 may select the features included in data dictionary 112 as a result of a data mining operation performed on a database. For example, if the administrator is attempting to create a report regarding a construction site, a data mining operation may be performed to gather all of the relevant data. If the administrator determines that enough data does not exist, or is not current, a new data dictionary (e.g., 112) may be created to gather enough data to create the report.

Section IV

Legacy Handheld Devices

Figure 2A:
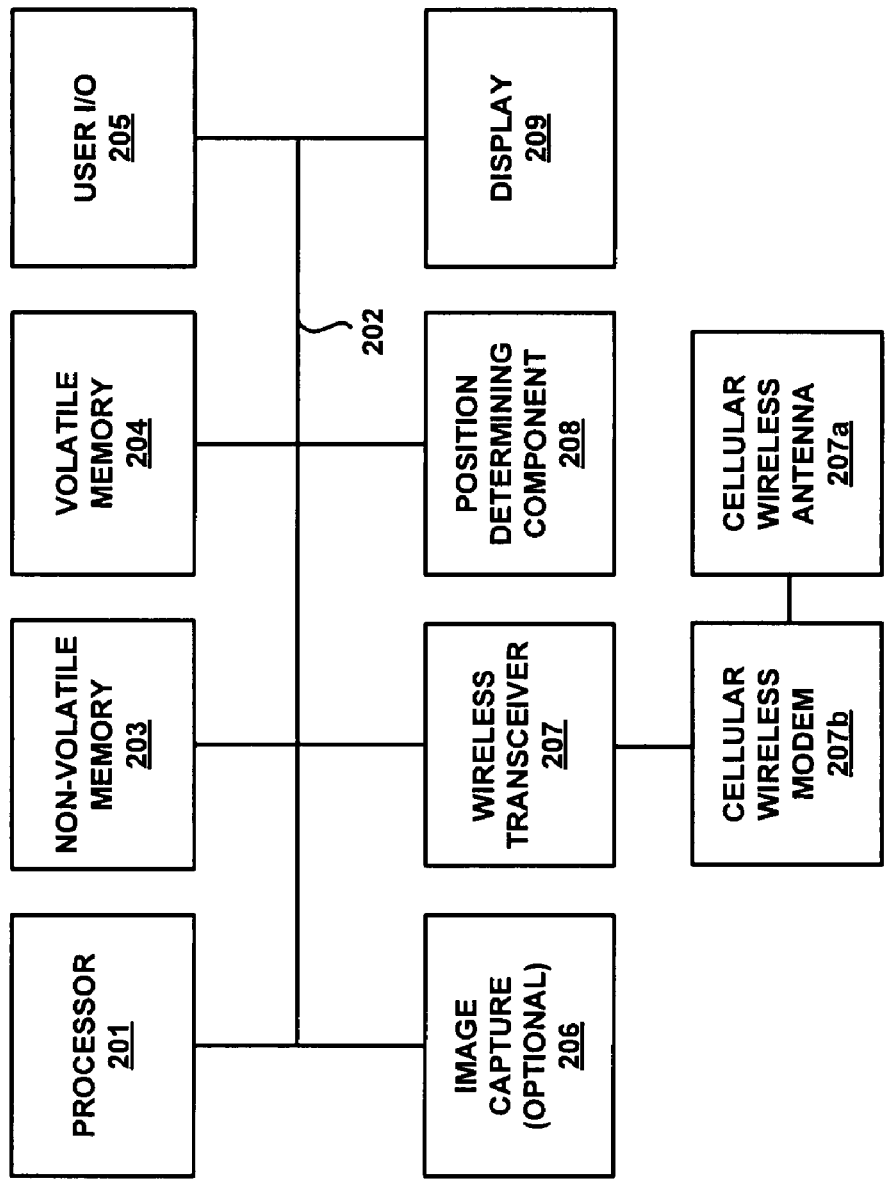
FIG. 2A depicts an exemplary legacy mobile electronic device used in accordance with embodiments of the present invention.

FIG. 2A is a block diagram of an exemplary legacy handheld mobile electronic device 110 used in accordance with embodiments of the present invention. It is again noted that mobile electronic device may be a cellular telephone, a PDA, a mobile computer system, or another handheld mobile electronic device which was not designed or manufactured to perform GIS data collection functions. It is further noted that mobile electronic device 110 may be configured differently than the exemplary device shown in FIG. 2A, depending upon what type of mobile electronic device is used. Furthermore, some components which may typically be used in, for example, a cellular telephone, PDA, or other mobile electronic device, have been omitted from FIG. 2A for clarity. In the embodiment of FIG. 2A, mobile electronic device 110 comprises a processor 201 coupled with an address/data bus 202. Processor 201 is for processing digital information and instructions and bus 202 is for conveying digital information between the various components of mobile electronic device 110. Also coupled with bus 202 is a non-volatile read only memory (ROM) 203 for storing information and instructions of a more permanent nature, and a random access memory (RAM) 204 for storing the digital information and instructions of a more volatile nature.

A user input device 205 is also coupled with bus 202 in embodiments of the present invention. In embodiments of the present invention, user input device 205 may comprise a keyboard for inputting data, selections, updates, and for controlling mobile electronic device 110. In embodiments of the present invention, user input device 205 may further comprise a cursor control device (e.g., a mouse, trackball, light pen, touch pad, joystick, etc.).

Mobile electronic device 110 may further comprise an optional image capture device 206. Image capture device 206 may comprise a charge coupled device (CCD), a complementary metal oxide semiconductor (CMOS) digital image capture device or another digital image capture device. In embodiments of the present invention, image capture device 206 may be used to capture still images, or moving images.

A wireless communications component 207 and a position determining component 208 are also coupled with bus 202. In embodiments of the present invention, position determining component 208 comprises a Global Navigation Satellite Service (GNSS) receiver and antenna. Wireless communications component 207 is for transmitting and receiving wireless messages (e.g., data and/or commands). In one embodiment, wireless communications component 207 is comprised of a cellular wireless antenna and a cellular wireless modem (not shown).

Position determining component 208 is for determining the location of mobile electronic device 110. In embodiments of the present invention, position determining component 208 comprises a GNSS antenna and a GNSS receiver. However, while the present embodiment specifically recites a GNSS position determining system, embodiments of the present invention are well suited to utilize a variety of terrestrial-based and satellite-based position determining systems as well. For example, in other embodiments of the present invention, position determining component 208 may use terrestrial based broadcast signals such as LORAN-C, Decca, radio beacons to determine the geographic position of mobile electronic device 110.

In embodiments of the present invention, mobile electronic device 110 further comprises a display device 209 for displaying information to a user. Display device 209 may be a liquid crystal device, cathode ray tube, a field emission display, or other display device suitable for creating graphic images and alpha-numeric characters recognizable to a user.

In embodiments of the present invention, components of mobile electronic device 110 may be disposed upon a printed circuit board such as a Personal Computer Memory Card Industry Association (PCMCIA) card, etc. This allows embodiments of the present invention to be used in a variety of mobile electronic devices such as cellular telephones, laptop computers, PDAs, and the like. Additionally, the components comprising mobile electronic device 110 may be disposed within a housing (not shown).

Figure 2B:
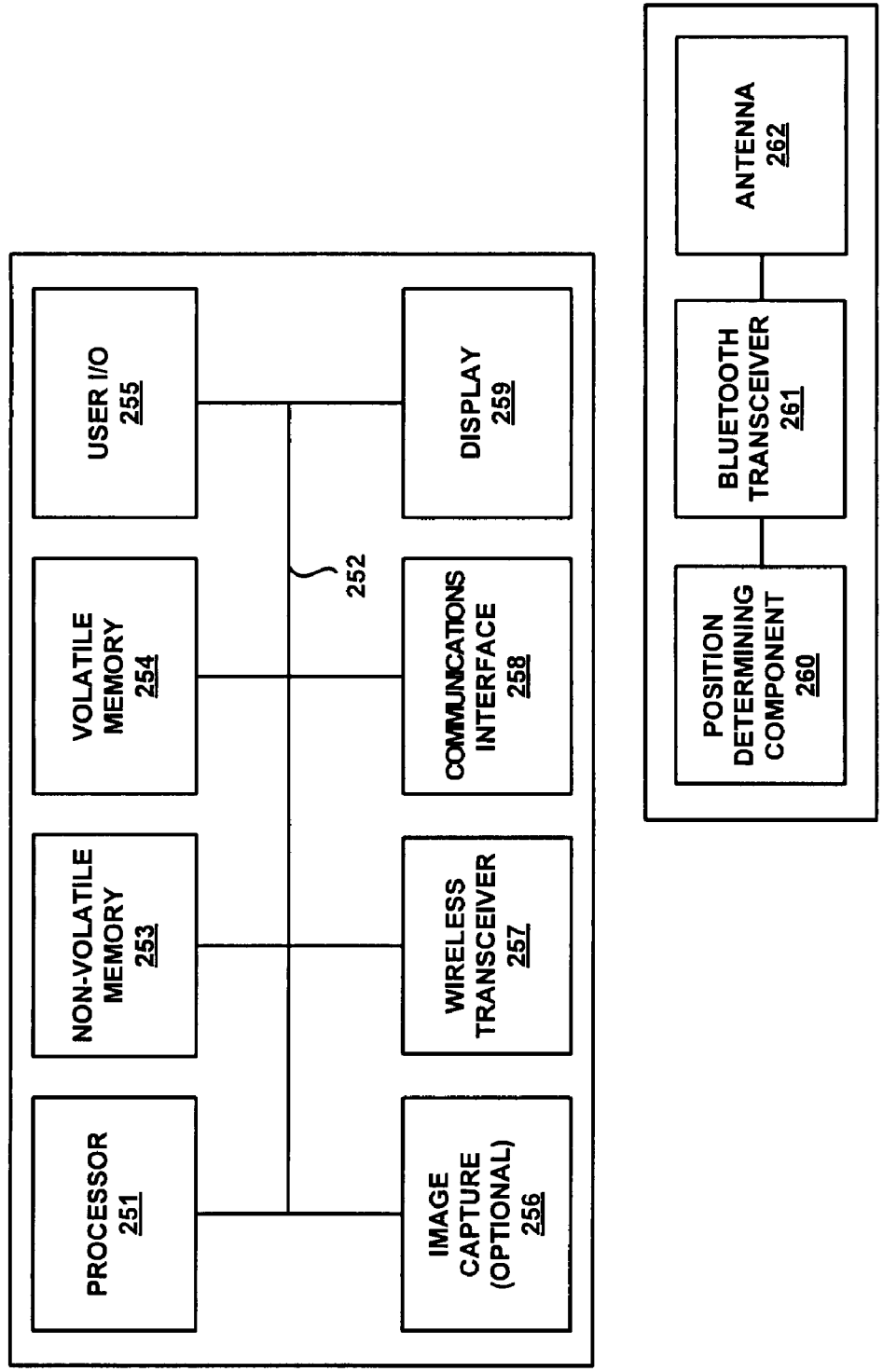
FIG. 2B depicts another exemplary legacy mobile electronic device used in accordance with embodiments of the present invention.

FIG. 2B depicts another exemplary mobile electronic device 110 used in accordance with embodiments of the present invention. Again, it is noted that mobile electronic device 110 may be configured differently than the exemplary device shown in FIG. 2A, depending upon what type of mobile electronic device is used. Furthermore, some components which may typically be used in, for example, a cellular telephone, PDA, or other mobile electronic device, have been omitted from FIG. 2A for clarity. In the embodiment of FIG. 2A, mobile electronic device 110 comprises a processor 251 coupled with an address/data bus 252. Processor 251 is for processing digital information and instructions and bus 252 is for conveying digital information between the various components of mobile electronic device 110. Also coupled with bus 252 is a non-volatile read only memory (ROM) 253 for storing information and instructions of a more permanent nature, and a random access memory (RAM) 254 for storing the digital information and instructions of a more volatile nature.

A user input device 255 is also coupled with bus 252 in embodiments of the present invention. In embodiments of the present invention, user input device 255 may comprise a keyboard for inputting data, selections, updates, and for controlling mobile electronic device 110. In embodiments of the present invention, user input device 255 may further comprise a cursor control device (e.g., a mouse, trackball, light pen, touch pad, joystick, etc.).

Mobile electronic device 110 may further comprise an optional image capture device 256. Image capture device 256 may comprise a charge coupled device (CCD), a complementary metal oxide semiconductor (CMOS) digital image capture device or another digital image capture device. In embodiments of the present invention, image capture device 256 may be used to capture still images, or moving images.

A wireless communications component 257 and a communications interface 258 are also coupled with bus 252. Wireless communications component 257 is for transmitting and receiving wireless messages (e.g., data and/or commands). In one embodiment, wireless communications component 257 is comprised of a cellular wireless antenna and a cellular wireless modem (not shown).

Communications interface 258 is for communicating with a position determining component 260. In embodiments of the present invention, communications interface 258 facilitates communicatively coupling a position determining component (e.g., 260), or other device, with mobile electronic device 110. In embodiments of the present invention, communications interface 258 may comprise a serial or parallel wired interface. In other embodiments of the present invention, communications interface 258 may comprise a wireless communications interface such as a Bluetooth or Wi-Fi transceiver which may be used to create short range local area networks.

In embodiments of the present invention, mobile electronic device 110 further comprises a display device 259 for displaying information to a user. Display device 259 may be a liquid crystal device, cathode ray tube, a field emission display, or other display device suitable for creating graphic images and alpha-numeric characters recognizable to a user.

In embodiments of the present invention, components of mobile electronic device 110 may be disposed upon a printed circuit board such as a Personal Computer Memory Card Industry Association (PCMCIA) card, etc. This allows embodiments of the present invention to be used in a variety of mobile electronic devices such as cellular telephones, laptop computers, PDAs, and the like. Thus, the components comprising mobile electronic device 110 may be disposed within a housing.

Position determining component 260 is for determining the location of position determining component 260. In embodiments of the present invention, position determining component 260 comprises a GNSS antenna and a GNSS receiver. However, while the present embodiment specifically recites a GNSS position determining system, embodiments of the present invention are well suited to utilize a variety of terrestrial-based and satellite-based position determining systems as well. For example, in other embodiments of the present invention, position determining component 260 may use terrestrial based broadcast signals such as LORAN-C, Decca, radio beacons to determine the geographic position of position determining component 260. Thus, in the embodiment of FIG. 2B, position determining component 260 facilitates determining the position of mobile electronic device 110 when no such capability has been built into the device.

Figure 3:
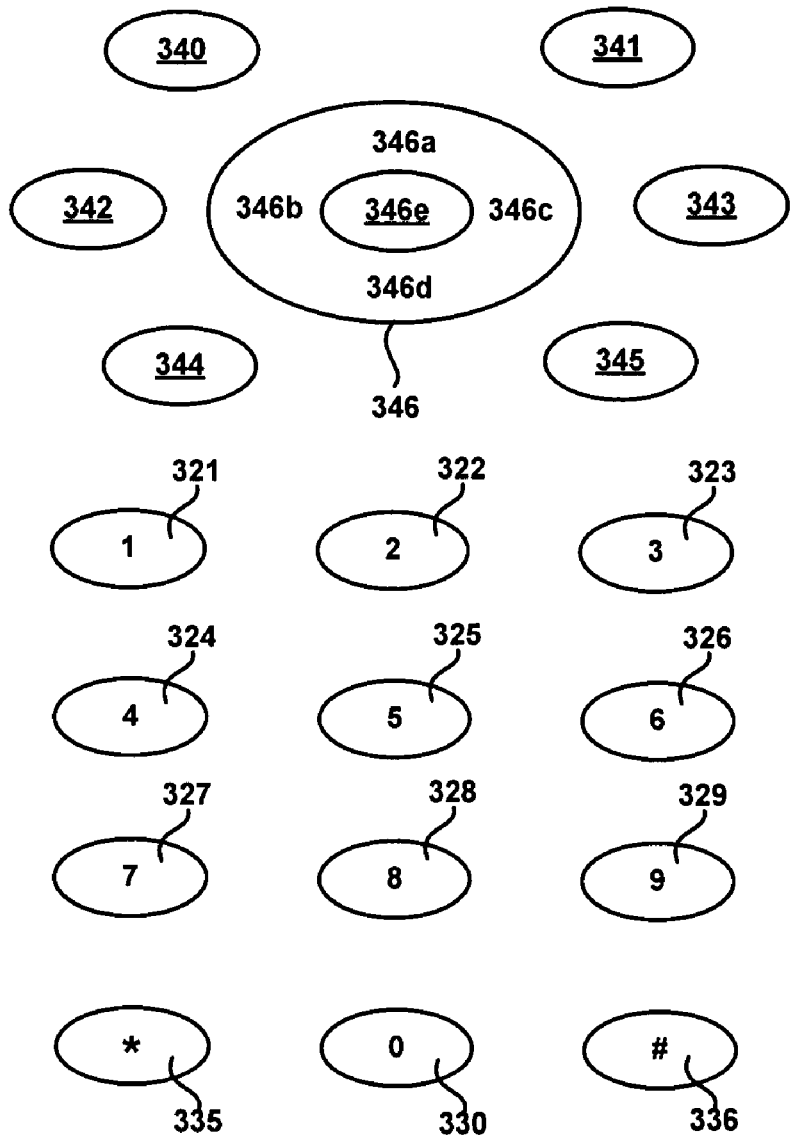
FIG. 3 shows an exemplary user input device used in accordance with embodiments of the present invention.

FIG. 3 shows an exemplary user input device (e.g., 205) used in accordance with embodiments of the present invention. Alpha-numeric user input devices (e.g., 205) are often used in cellular telephones to allow a user to input text or numeric characters. In the embodiment of FIG. 3, user input device 205 comprises a numeric keypad area 310. More specifically, buttons 321, 322, 323, 324, 325, 326, 327, 328, 329, and 330 are associated with the numbers 1, 2, 3, 4, 5, 6, 7, 8, 9, and 0 respectively. Additionally, letters of the alphabet are associated with particular buttons of user input device 205. For example, the letters A, B, and C are associated with button 322, the letters D, E, and F are associated with button 323, etc. By switching between a text mode and a numeric mode, a user can input alpha-numeric characters using user input device 205. This is advantageous because a full numeric keyboard would require more space than can be reasonably provided on a cellular telephone. Finally, buttons 335 and 336 correspond to the * and # buttons respectively of a cellular telephone interface.

In the embodiment of FIG. 3, user input device 205 further comprises a plurality of buttons for interacting with and navigating a user interface displayed by display device 207. As shown in FIG. 3, these comprise buttons 340, 341, 342, 343, 344, and 345. In embodiments of the present invention, buttons 340-345 can be mapped to a variety of functions based upon the current operating mode of mobile electronic device 110. Also shown in FIG. 3 is a 5-way navigation key 346. Users of mobile electronic device 110 can use 5-way navigation key can press one of regions 346a, 346b, 346c, and 346d to navigate a displayed user interface, move a cursor, etc. A user can also press region 346e to select a highlighted option on the displayed user interface.

Embodiments of the present invention are advantageous over conventional GIS data collectors in some situations in which the cost of hardware and training may prevent an organization from deploying a sufficient number of data collectors. For example, as discussed above, conventional dedicated GIS data collectors are expensive (e.g., $1500-5000 per unit) in addition to the cost of a desktop computer or terminal for uploading/downloading data. Additionally, a typical dedicated GIS data collector application provides a much richer functionality, and thus utilizes a more complicated user interface for inputting and managing data than embodiments of the present invention. As a result, extensive, and costly, training is necessary in order to train an operator to effectively utilize the data collector. Thus, many organizations are not able to deploy as many GIS data collectors as they wish due to the cost. This in turn may create a backlog of data collection which limits collecting accurate information in a timely manner as there are fewer data collectors deployed to record data.

However, embodiments of the present invention reduce the cost of deploying GIS data collectors by modifying legacy mobile electronic devices such as cellular telephones, PDAs, or even laptop computers to perform GIS data collector functions. This greatly reduces the cost of deploying data collectors due to the fact that cellular telephones and PDAs are far less expensive (e.g., hundreds of dollars) than conventional dedicated GIS data collectors. Additionally, because the data input devices of, for example, cellular telephones are far simpler than the user interface found in a typical dedicated GIS data collector, it is much easier to train an operator to effectively utilize the legacy device as a GIS data collector in accordance with embodiments of the present invention. Furthermore, because the GIS data collector application (e.g., 111) and the data dictionary (e.g., 112) can be uploaded onto mobile electronic device 110 via a wireless network, and because recorded data is sent to and stored by storage and forwarding server 130, there is no requirement for a dedicated desktop computer or terminal for uploading/downloading data. An added benefit is the reduced need for the operator of mobile electronic device 110 to manage the collected data and/or updates to GIS data collector application 111 or data dictionary 112. As a result of the reduced cost per unit and reduced training time, embodiments of the present invention facilitate deploying a far larger workforce of GIS data collectors. As a result, backlogs in the collection of GIS data can be reduced and data can be collected in a more timely manner. Additionally, as discussed above, because of the ability to rapidly reconfigure the data dictionaries, embodiments of the present invention may increase the productivity of workers for collecting GIS data.

Section V

GIS Data Collector Application

In embodiments of the present invention, GIS data collector application 111 is compatible with commonly implemented mobile software operating systems such as the Java Platform, Micro Edition (Java ME), or the Windows Mobile® platforms which are operable upon, for example, mobile electronic device 110. However, it is noted that embodiments of the present invention are not intended to be limited to these two operating systems alone. In embodiments of the present invention, GIS data collector application 111 allows a user of mobile electronic device 110 to record geographic position data (e.g., GNSS position data), as well as feature and attribute data. In embodiments of the present invention, all interaction between GIS data collector application 111 and storage and forwarding server 130 is initiated by GIS data collector application 111. This avoids the need for storage and forwarding server 130 to "know" the IP address for mobile electronic device 110 and how to find it within wireless network 120. Additionally, in embodiments of the present invention, GIS data collector application 111 also facilitates automatically sending the collected GIS data to storage and forwarding server 130 as soon as it is recorded, or as soon as possible upon establishing communications therewith.

In embodiments of the present invention, GIS data collector application 111 implements the Transmission Control Protocol/Internet Protocol (TCP/IP) specification as the base layer of the networking stack. TCP guarantees that data will arrive across a connection (e.g., wireless network 120) in the order in which it was sent and that while the connection remains unbroken, the sent data will arrive at the other side of the connection.

In embodiments of the present invention, the application layer of the networking stack is compliant with the Wireless Application Protocol (WAP) Binary XML (WBXML) protocol. WBXML is a standard defined by the W3 consortium to provide a binary version of XML which meets as many of the goals of XML as possible, but in a form suitable for low bandwidth/high latency data transfers. Furthermore, WBXML is widely supported by third-party developers. WBXML provides the ability to describe complex data objects and provide extensibility for new types of data objects in the future.

FIGS. 4A and 4B show exemplary screens displayed by a user interface in accordance with embodiments of the present invention. In embodiments of the present invention, the user interface for GIS data collector application 111 is intended to provide a simple, easily navigated interface for collecting GIS data. Thus, a field worker whose primary duty is not GIS data collection can still record simple feature and attribute information and send it back to GIS data network 140. Additionally, by providing a simpler interface, less training is required for each worker. For example, workers should not need any previous GPS, GIS, or data collection experience in order to utilize GIS data collector application 111. In embodiments of the present invention, in addition to providing fast and simplified data collection functionality, GIS data collector application 111 also offers simple GPS status, map views, and navigation functionality.

In embodiments of the present invention, a screen displayed by GIS data collector application 111 is typically divided into 3 sections. A "title" of the screen is typically displayed in a bar at the top of the display. A bottom line shows text labels which indicate softkey functions. The softkeys are activated by pressing buttons of the user input device (e.g., buttons 340 and 341 of user input device 205) which are proximate to the displayed softkey. Typically, the right softkey is used for negative actions (e.g., cancel, back, and no), while the left softkey is used for positive actions (e.g., OK, next, and yes). Other keys may be used to navigate around screens such as up/down arrow keys to move up and down a list, or to the bottom line of a display. Similarly, left/right arrow keys may be used to navigate menus, or softkey options. Referring again to FIG. 3, the up/down and left/right functions may be mapped to 5-way navigation key 346, or to other keys of user input device 205. Between the top line and the bottom line, is the data area of the screen for displaying text, characters, and figures, photographs, maps, etc.

In embodiments of the present invention, GIS data collector application 111 will assume a minimum screen size of 128×128 pixels, but will scale up to automatically fit screens that are wider and/or taller such that displayed maps fill the entire data area of the screen, and long menus will display more items. As described above, in embodiments of the present invention, GIS data collector application 111 is compliant with the Java ME specification. Typically, Java supports two types of screens: forms and canvases. In a form, the user interface is mainly determined by the Java engine, with the application supplying the text fields. In a canvas, the application draws screen elements (e.g., a map, etc.). In embodiments of the present invention, forms will typically be either menus or data entry forms. Data entry within a form uses whatever input methods the field device has available (e.g., predictive text, T9 input, etc.). Typically, entering data in a field should be similar to entering a new name and phone number in the address book of, for example, a cellular telephone. Additionally, entry methods of a particular field may depend upon the field type (e.g., GIS data collector application 111 automatically switches to numeric entry mode for a number field). In embodiments of the present invention, the user interface of GIS data collector application 111 is compliant with the mobile information device profile (MIDP) standard.

Referring to screen 401 of FIG. 4A, an exemplary main menu screen is displayed which allows a user to select which function is to be performed. It is noted that the following screens are exemplary and that other implementations are possible in embodiments of the present invention. Thus another embodiment may use additional screens (not shown), or not use some of the screens discussed below. As shown in screen 401, a user has an option to implement a "Collect data" option (e.g., 401*a*), enter a "Setup" mode (e.g., 401*b*), enter a "Status" mode 401*c*, or to "Exit" (e.g., 401*d*) GIS data collector application 111. In embodiments of the present invention, navigating and selecting the displayed options may be performed with user input device 205. It is noted that in embodiments of the present invention, the setup and status options may not be made available to a user in order to simplify the user interface of GIS data collector application 111. In the embodiment of FIG. 4A, a user has highlighted the "Collect data" option. When the user then indicates "Select" (e.g., by initiating softkey function 401 e), screen 402 is displayed. In embodiments of the present invention, if the position determining component 208 has been disabled in mobile electronic device 110, a warning message will be displayed stating that the user must first enable GNSS.

In embodiments of the present invention, GIS data collector application 111 will determine if data dictionary 112 is current. In one embodiment, when communications are established between mobile electronic device 110 and storage and forwarding server 130, mobile electronic device will generate a query for the latest version of the data dictionary (e.g., 112 of FIG. 1) for the workgroup to which mobile electronic device 110 is assigned. If the data dictionary 112 is not current, the latest version will be automatically uploaded onto mobile electronic device 110. In embodiments of the present invention, this is done in a manner that is transparent to the user of mobile electronic device 110. For example, when attempting to collect GIS data, the user of mobile electronic device 110 establishes communications with storage and forwarding server 130 by dialing a telephone number, or by initiating GIS data collector application 111. Upon establishing communications with storage and forwarding server, GIS data collector application 111 determines the version number of the latest available data dictionary. If the latest available data dictionary is more recent than the data dictionary stored upon mobile electronic device 110, GIS data collector application 111 initiates automatically uploading the latest available data dictionary. Alternatively, storage and forwarding server 130 may initiate automatic uploading of the latest available data dictionary onto mobile electronic device 110. If a data dictionary 112 has not yet been assigned to mobile electronic device 110 by the administrator of GIS data network 140, a sample data dictionary (not shown), which is included when GIS data collector application 111 is first loaded onto mobile electronic device 110, may be utilized. The sample data dictionary is used until the latest version of data dictionary 112 is uploaded onto mobile electronic device 110. It is appreciated that the screenshots shown in FIGS. 4A and 4B are exemplary.

Referring to screen 402 of FIG. 4A, the user is presented with a list of feature types. In embodiments of the present invention, this list is based upon the feature types selected by an administrator of GIS data network 140 and forwarded to mobile electronic device 110 in data dictionary 112. The user then selects a feature type whose attributes will be collected. In screen 402, the selected feature type is a tree (e.g., 402a). Other feature types shown in screen 402 whose attributes can be collected include a lamp-post (402b), a road (402c), a sewer (402d), and a parking lot (402e). It is noted that these feature types are exemplary and that embodiments of the present invention may be used to record the attributes of other feature types as well.

Upon identifying the correct feature type, the user presses the "Select" button (402g). In embodiments of the present invention, mobile electronic device 110 checks whether a current (e.g., <3 seconds old) GNSS position has been determined by position determining component 208. In one embodiment, if a current geographic position cannot be determined (e.g., due to obstruction of GNSS signals, etc.) GIS data collector application 111 displays a warning to the user that position determination is not currently possible. This prevents a user from wasting time entering attribute values about a feature only to discover that they cannot determine the geographic position of that feature. In embodiments of the present invention, if a current GNSS position fix is available, GIS data collector application 111 determines whether a feature of the selected type has been recorded in this session. If it has, GIS data collector application 111 displays screen 403.

Referring to screen 403 of FIG. 4A, a user is presented with the option to repeat the attribute values of the previously mapped tree (e.g., 403a), or to select the default values of data dictionary 112 (e.g., 403b). The user can them modify attribute values as needed based upon the feature currently being recorded Referring to screen 404 of FIG. 4A, GIS data collector application 111 displays attribute fields for recording data about a particular feature (e.g., tree 194). In the example of screen 404, the attributes of tree comprise the species (e.g., 404a) and the height (e.g., 404b) of a tree, and the date (e.g., 404c). Again, it is noted that the attributes displayed by GIS data collector application 110 are based upon data dictionary 112 and are selected by an administrator of GIS data network 140. In embodiments of the present invention, data dictionary 112 supports, but is not limited to, the following attribute types:

Text fields
Pulldown menus
Numeric fields
Dates
Times
Photographs

In embodiments of the present invention, the date and time attributes may be automatically entered by GIS data collector application 111. When all the attributes are collected, the user presses the save button to automatically store data and return to the list of feature types (e.g., screen 402). Alternatively, the user can press cancel to discard the presently selected feature. The user is then asked to confirm the indicated choice to avoid unintended cancelling, or premature saving, of data.

In one embodiment of the present invention, the user of mobile electronic device utilizes GIS data collector application 111 to generate a position fix when proximate to a feature which is to be recorded. Once GIS data collector application 111 determines that an adequate GNSS position fix has been obtained, an attribute entry form (e.g., screenshot 403, or 404) is displayed. GIS data collector application 111 may either use the GNSS position fix originally generated, or continue to log GNSS position fixes until the "Save" or "Cancel" softkey function is selected. In another embodiment of the present invention, when a user starts a feature, at least one GNSS position fix is needed. If position determining component 208 is enabled, GIS data collector application 111 may automatically initiate generating a GNSS position fix. In other words, position logging and attribute entry may be performed simultaneously in one embodiment. In embodiments of the present invention, GIS data collector application 111 continues to log GNSS position fixes to the feature until the user chooses either the "Save" or "Cancel" softkey function. For point features, all position fixes received at the configured (e.g., time based) logging interval are stored by mobile electronic device 110 and a weighted average is used for the feature's display. For line and polygon features, all position fixes are stored with the feature by mobile electronic device 110 and are sent back to storage and forwarding server 130 when the feature is saved. In embodiments of the present invention, post processing of GNSS position fixes for line and polygon features may be performed by storage and forwarding server 130. Additionally, for point features, at least one GNSS position fix must be logged in order to save the feature. For line features, at least two GNSS position fixes must be logged in order to save the feature. In the case of polygon features, at least three GNSS position fixes must be logged in order to save the feature. If any of these rules are violated, the user will receive a message stating that they need to have a minimum number of GNSS position fixes logged in order to record that type of feature.

In embodiments of the present invention, after a user has pressed "Save" and confirmed the choice, GIS data collector application 111 determines whether compulsory attribute rules have been observed. If a compulsory attribute rule is not observed, GIS data collector application 111 displays a warning telling the user which attributes must be correctly entered before the user can proceed. In embodiments of the present invention, once the attributes of a feature have been saved, the recorded data is automatically sent to storage and forwarding server 130 via wireless network 120. Alternatively, if mobile electronic device 110 is unable to establish communications with storage and forwarding server 130, the data is stored locally (e.g., in non-volatile memory 203) until communications can be established. When communications are established, the recorded data is automatically sent to the server.

As described above, when a user selects a feature, it is determined that a current GNSS position fix is available. In embodiments of the present invention, a non-filtered average of the incoming position fixes is stored. However, a weighted average of selected incoming position fixes of point features may be stored in another embodiment of the present invention. This facilitates determining the geographic position of mobile electronic device 110 with greater precision by filtering outlier values from the data set. With line and area features, selected positions are also stored with the presumption that the user of mobile electronic device 110 is walking or driving along the line or area feature. In embodiments of the present invention, the selection criteria for GNSS position fixes of line and/or area features may be a time-based logging interval, or distance-based logging interval.

Referring to screen 405 of FIG. 4A, an exemplary setup interface is displayed. In embodiments of the present invention, screen 405 may be displayed by GIS data collector application 111 in response to a user selecting "Setup" option 401b from screen 401. In embodiments of the present invention, the only configurations permitted via the "Setup" option are unit specific. Other configurations of data dictionary 112 and GIS data collector application 111 are typically performed by an administrator of GIS data network 140. This simplifies the implementation of a GIS data collection device in the field for users having little training and/or experience with GIS data collectors, and reduces the possibility that a user may inadvertently disable GIS data collector application 111 because of a configuration error. As shown in screen 405, the user can select a "Settings" option (e.g., 405a), a "Waypoints" option (e.g., 405b), an "Activate" option (e.g., 405c), and an "About" option (e.g., 405d). As shown in screen 405, a user has selected the "Settings" option 405a.

Referring to screen 406 of FIG. 4A, the configurable options under "Settings" are shown. In the example of screen 406, the user has the option to "Clear Map" (e.g., 406a) and to "Beep When Logging" (e.g., 406b). The "Beep When Logging" allows a user to disable the default setting in which mobile electronic device 110 generates an audible signal when a button is pressed. It is noted that other settings may be set upon uploading a settings file (not shown) from storage and forwarding server 130. Other settings which are not typically accessible to a user of mobile electronic device 110 include:

Unit system. (Default is English, but Metric is also optional)
Lat/Lon Format (Default is "Deg/Min/Sec"
Arrival radius (Default is 100 m)
Update Rate (Default is 1 second. Can be changed to save battery life and file size)
Update Distance (Default is 5 m)
Camera (Default is enabled)
Camera Resolution (Default is "High" (648×480))
Camera Quality (Default is "High")
Track When Closed (Default is "Enabled". Can be changed to improve battery life or GNSS responsiveness)
GNSS assist (Default is enabled)

In embodiments of the present invention, the "Clear Map" option clears any collected features, but not waypoints, from the map display. In embodiments of the present invention, a map screen (e.g., 410 of FIG. 4B) continues to display the features that have been collected until the map is cleared. In embodiments of the present invention, if memory resources are becoming full, the map screen of features will be automatically cleared, in order of oldest to most recent. This prioritizes memory resources for saved feature data. In embodiments of the present invention, GIS data collector application 111 will clear as many features from the map display as are needed in order to save the feature attributes.

Referring to screen 407 of FIG. 4B, an exemplary waypoints screen is shown which may be accessed when a user selects the "Waypoints" option of screen 405 (e.g., 405b) and presses the "Select" button. As shown in screen 407, a user can select the "Go To" option (e.g., 407a) to cause a particular waypoint to be displayed. The user can select the "Edit" option (e.g., 407b) to edit data associated with a particular waypoint. The user can also add new waypoints or delete existing waypoints by selecting the "Add New" or "Delete" options (e.g., 407c and 407d respectively). It is noted however, waypoints may not be implemented in embodiments of the present invention in order to simplify the functionality of GIS data collector application 111.

In embodiments of the present invention, when a user selects the "Status" option (e.g., 401c) from main menu screen 401, they can select from a variety of status screens which provide a basic position display. Typically, the user will automatically come to the status screen they previously used. The user can then toggle among the various available status screens until a desired position display type is shown.

Referring to screen 408 of FIG. 4B, a default GNSS skyplot display is shown. If the user wants to see a different display, pressing the "Next" button will cause GIS data collector application 111 to display screen 409.

Referring to screen 409 of FIG. 4B, a compass with GNSS position, speed and altitude are displayed. If the user wants to see a different display, pressing the "Next" button again will cause GIS data collector application 111 to display screen 410.

Referring to screen 410 of FIG. 4B, a track of where the user has previously been is shown. In embodiments of the present invention, features collected may also appear on screen 410 as they are collected. This gives a visual representation of where the user has been, and where they should go next. Additionally, in embodiments of the present invention, the user of mobile electronic device 110 cannot see the attributes and values of a given feature after they have been collected. Additionally, in embodiments of the present invention, the only way to erase them is via the "Clear Map" option (e.g., 406a) of screen 406.

In embodiments of the present invention, a map scale and a trail of GNSS position fixes between features not yet cleared from the map are displayed.

Referring again to screen 401, a user can select the "Exit" option at any time. Additionally, in embodiments of the present invention, GIS data collector application 111 can be suspended if the user of mobile electronic device wishes to run other applications. Additionally, in embodiments of the present invention, operation of GIS data collector application 111 is automatically suspended when an incoming telephone call is received.

In embodiments of the present invention, when map screen 410 is displayed, GIS data collector application 111 maps the following functions to buttons of user input device 205:

Up Arrow (e.g., 346a)=Pan Map Up
Down Arrow (e.g., 346d)=Pan Map Down
Left Arrow (e.g., 346b)=Pan Map Left
Right Arrow (e.g., 346c)=Pan Map Right
Center Button (e.g., 346e)=Center Map Display
Button 321=Pan Map Left Up
Button 322=Pan Map Up
Button 323=Pan Map Right Up
Button 324=Pan Map Left
Button 325=Center Map Display
Button 326 Pan Map Right
Button 327=Pan Map Down Left
Button 328=Pan Map Down
Button 329=Pan Map Down Right
Button 330=Toggle GNSS Trail
Button 335=Zoom to Extents
Button 336=Toggle Auto Pan In embodiments of the present invention, GIS data collector application 111 automatically handles some data management functions for the user. As stated above, this includes, but is not limited to, automatically forwarding collected GIS data to storage and forwarding server 130 when the data is saved.

In embodiments of the present invention, if communications with storage and forwarding server 130 are not yet established, or lost, GIS data collector application 111 will automatically save the collected GIS data (e.g., in non-volatile memory 203). Additionally, upon determining that communications with storage and forwarding server 130 have been established, GIS data collector application 111 will determine if GIS data is stored in non-volatile memory 203 and automatically forward the stored data.

Furthermore, upon receiving a message which confirms that the collected GIS data has been successfully stored on storage and forwarding server 130, GIS data collector application 111 will automatically erase that data from mobile electronic device 110 (e.g., from non-volatile memory 203 and/or from volatile memory 204). Alternatively, data collector application may mark the GIS data as marked as "Transferred" and stored for future reference. As described above, if memory resources of mobile electronic device 110 become full, the GIS data marked as "Transferred" may be erased to make more memory available. In embodiments of the present invention, GIS data collector application 111 also facilitates automatically uploading data dictionary 112 from storage and forwarding server 130. Thus, embodiments of the present invention provide a variety of automatically performed operations which simplify using a legacy mobile device as a GIS data collector, especially for users who have not been extensively trained in the use of dedicated GIS data collection devices.

In embodiments of the present invention, GIS data collector application 111 checks whether it has been activated with storage and forwarding server 130, checks whether its subscription is still valid, checks whether software updates are needed to meet minimum requirements, and whether updates for data dictionary 112 are available upon start-up. If an account for mobile electronic device 110 is not activated (e.g., not registered with storage and forwarding server 130), storage and forwarding server 130 may generate a prompt telling the user of mobile electronic device 110 to contact GIS data network 140 and initiate activation.

If GIS data collector application 111 cannot contact storage and forwarding server 130, the last known authentication status will be assumed. Thus, if the user was authenticated the last time storage and forwarding server 130 was contacted, it is assumed that the user is still authenticated until communications can again be established. If the user was not authenticated the last time storage and forwarding server 130 was contacted, it is assumed that the user is still not authenticated until communications can again be established.

Section VI

Storage and Forwarding Server

As described above, storage and forwarding server 130 is responsible for storage of data dictionary and workgroup data, as defined by GIS data network 140. Storage and forwarding server 130 is also for storing account management and for GIS data network 140, delivery of the appropriate data dictionaries to any and all mobile electronic devices of an assigned workgroup, storage and transfer of feature and attribute data from the mobile electronic device (e.g., 110) to GIS data network 140, feature processing if necessary, and hosting of web services for GIS data network 140.

Figure 5:
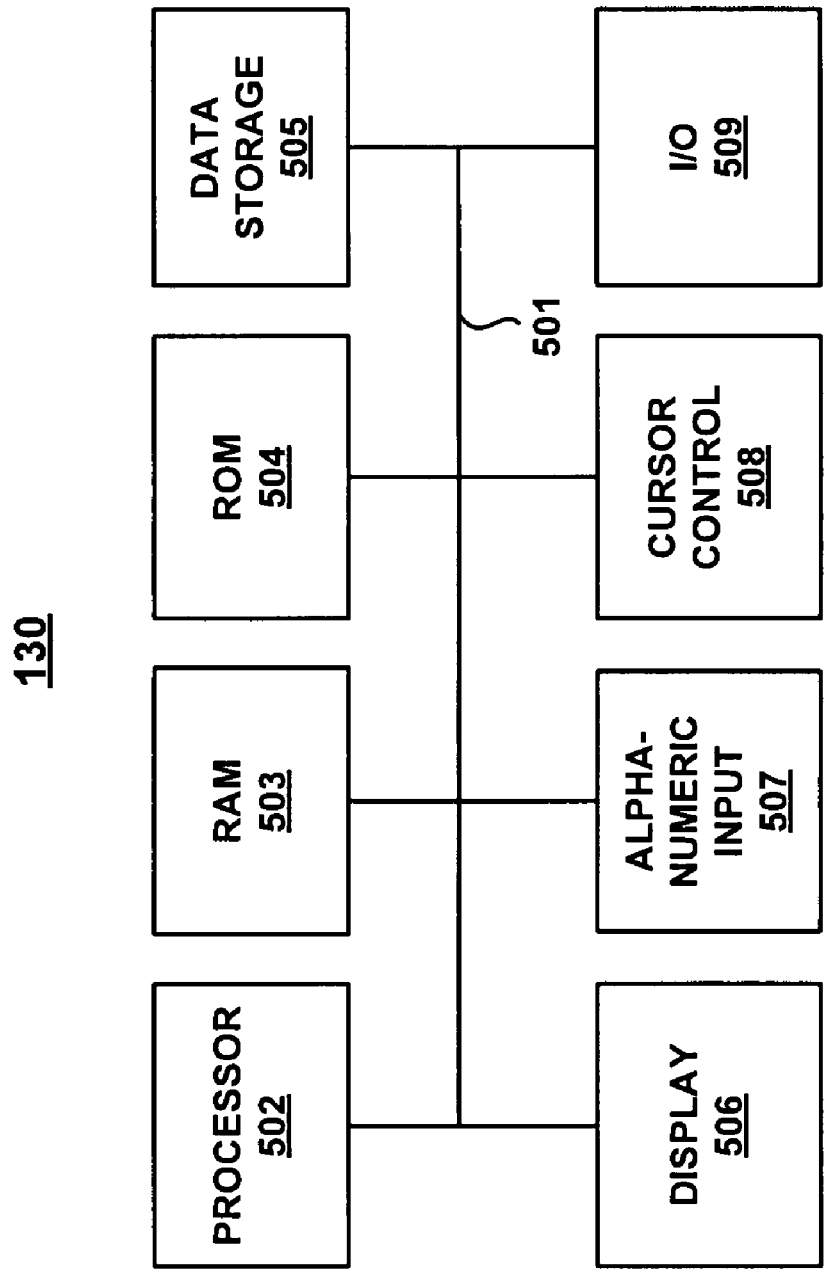
FIG. 5 is a block diagram of an exemplary computer system used in accordance with embodiments of the present invention.

With reference to FIG. 5, portions of the present invention are comprised of computer-readable and computer-executable instructions that reside, for example, in computer system 500 which is used as a part of a computer network (e.g., storage and forwarding server 130 of FIG. 1). It is appreciated that computer system 500 of FIG. 5 is exemplary only and that the present invention can operate within a number of different computer systems including general-purpose computer systems, networked computer systems, and stand-alone computer systems.

In the present embodiment, computer system 500 includes an address/data bus 501 for conveying digital information between the various components, a central processor unit (CPU) 502 for processing the digital information and instructions, a volatile main memory 503 comprised of volatile random access memory (RAM) for storing the digital information and instructions, and a non-volatile read only memory (ROM) 504 for storing information and instructions of a more permanent nature. In addition, computer system 500 may also include a data storage device 505 (e.g., a magnetic, optical, floppy, or tape drive or the like) for storing vast amounts of data. It should be noted that the software program for creating a GIS data collection network of the present invention can be stored either in volatile memory 503, data storage device 505, or in an external storage device (not shown).

Devices which are optionally coupled to computer system 500 include a display device 506 for displaying information to a computer user, an alpha-numeric input device 507 (e.g., a keyboard), and a cursor control device 508 (e.g., mouse, trackball, light pen, etc.) for inputting data, selections, updates, etc. Computer system 500 can also include a mechanism for emitting an audible signal (not shown).

Returning still to FIG. 5, optional display device 506 of FIG. 5 may be a liquid crystal device, cathode ray tube, or other display device suitable for creating graphic images and alpha-numeric characters recognizable to a user. Optional cursor control device 508 allows the computer user to dynamically signal the two dimensional movement of a visible symbol (cursor) on a display screen of display device 506. Many implementations of cursor control device 508 are known in the art including a trackball, mouse, touch pad, joystick, or special keys on alpha-numeric input 507 capable of signaling movement of a given direction or manner displacement. Alternatively, it will be appreciated that a cursor can be directed and/or activated via input from alpha-numeric input 507 using special keys and key sequence commands. Alternatively, the cursor may be directed and/or activated via input from a number of specially adapted cursor directing devices.

Furthermore, computer system 500 can include an input/output (I/O) signal unit (e.g., interface) 509 for interfacing with a peripheral device (e.g., a computer network, modem, mass storage device, etc.). Accordingly, computer system 500 may be coupled in a network, such as a client/server environment, whereby a number of clients (e.g., personal computers, workstations, portable computers, minicomputers, terminals, etc.) are used to run processes for performing desired tasks. In particular, computer system 500 can be coupled in a system for creating a GIS data collection network.

Creating Accounts

In embodiments of the present invention, an administrator of GIS data network 140 uses web browser 141a to interact with administrative website 135 of storage and forwarding server 130. If an account for GIS data network 140 has not yet been established with storage and forwarding server 130, the administrator of GIS data network 140 can access a "New Account" section via Administrative Website 135 and register an account with storage and forwarding server 130. In embodiments of the present invention, upon receiving the account registration information, storage and forwarding server 130 sends an e-mail to the administrator providing the account name and a temporary password for the account. The administrator can then access their account and change the password.

In embodiments of the present invention the administrator then adds or registers each mobile electronic device 110 with the account established with storage and forwarding server 130. In embodiments of the present invention, the registration information of each mobile electronic device (e.g., 110) is stored in database 134 when the administrator registers the device. If the administrator needs to edit a particular entry of a particular mobile electronic device (e.g., 110), they can select the "Edit" function. The previously stored account information of mobile electronic device 110 will be displayed and the administrator can edit the data fields. As an example, the administrator may register a phone number assigned to mobile electronic device 110, a description of mobile electronic device 110, first and last name of the user of mobile electronic device 110, and the International Mobile Equipment Identification (IMEI) number of mobile electronic device 110 to the account. Typically, if the administrator does not assign a workgroup to the mobile electronic device, it defaults to the default workgroup which comprises all mobile electronic devices registered to that account.

The administrator can then create workgroups and assign registered mobile electronic devices to them. In embodiments of the present invention, workgroups define a particular group of handsets (e.g., mobile electronic device 110), and all or a subset of feature types of the data dictionary of GIS data network 140. To create a new workgroup, the administrator clicks the Create New Workgroup button and then types in the workgroup name. To delete a workgroup, the administrator selects it from the drop-down list and then clicks the Delete Workgroup button. The administrator is not permitted to delete the default workgroup. It is noted that creating workgroups is only one of many ways in which the administrator of GIS data network 140 may choose to manage the mobile electronic devices, and their respectively assigned data dictionaries in accordance with embodiments of the present invention. The administrator may choose to manage the mobile electronic devices individually, or create other groupings of mobile electronic devices.

In one embodiment, once a workgroup is selected in a displayed drop-down list, there are controls to add mobile electronic devices (e.g., 110) to the account. In one embodiment, clicking an Add button brings up a new page listing all of the mobile electronic devices which are registered to the account of GIS data network 140. There are Add and Remove buttons in this list which permits the administrator to add or delete handsets from the workgroup currently displayed.

Storing Data Dictionaries

In embodiments of the present invention, a copy of a data dictionary file (DDF 143 of FIG. 1) is imported onto storage and forwarding server 130 from GIS data network 140 (e.g., data dictionary 143a). Additionally, the administrator can create new features and associated attributes, or modify existing ones which are then stored in data dictionary 143a of database 134. Then the administrator of GIS data network 140 identifies which of the feature types comprising data dictionary 143a will be sent to the mobile electronic devices assigned to a particular workgroup as data dictionary 112. Thus, each data dictionary 112 may be a subset of the entire data dictionary 143a stored on database 134. In other words, the administrator of GIS data network 140 assigns devices to workgroups and then selects which feature types can be recorded by a particular workgroup. However, in embodiments of the present invention, the entire set of feature types comprising data dictionary 143a may be sent to mobile electronic device 110 as data dictionary 112. Alternatively, a plurality of discreet data dictionaries 112 may be stored in database 134 which correspond to a plurality of assigned workgroups.

Figure 6:
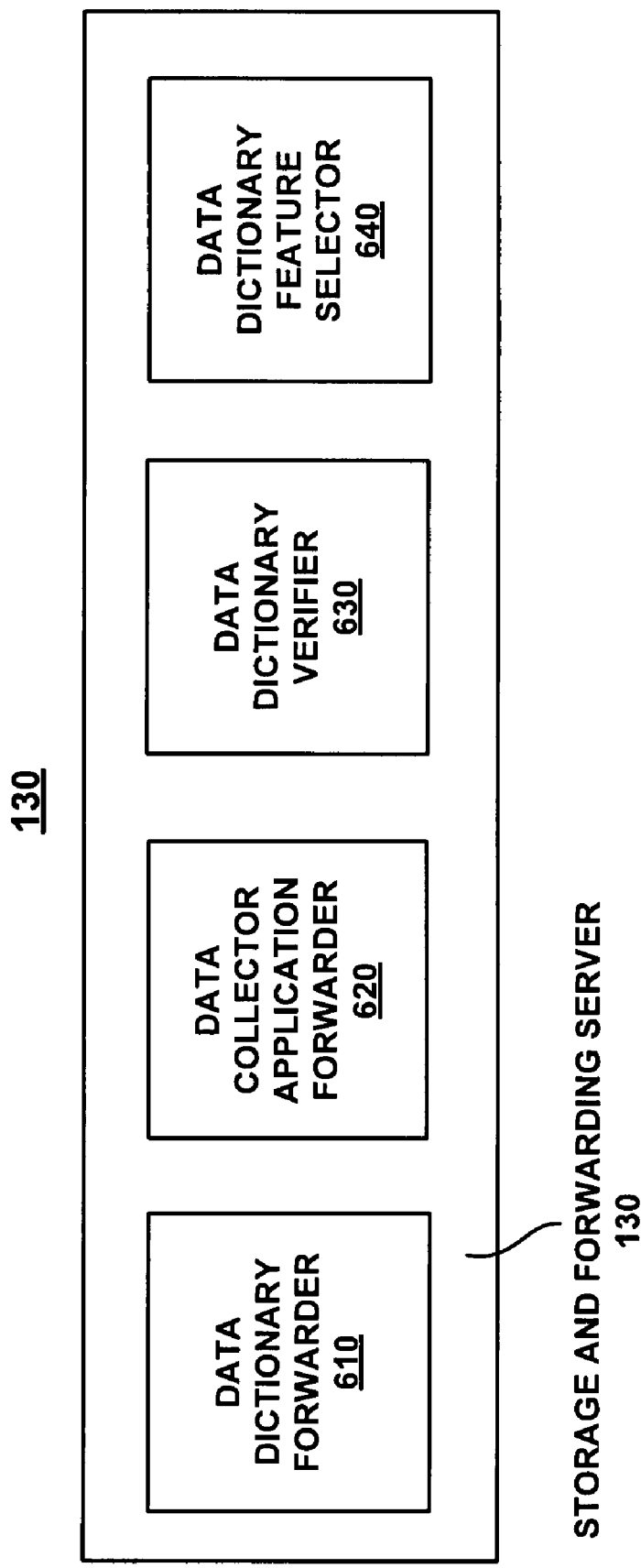
FIG. 6 is a block diagram of components of a storage and forwarding server in accordance with embodiments of the present invention.

In embodiments of the present invention, storage and forwarding server 130 is for configuring mobile electronic devices (e.g., 110), including legacy mobile electronic devices, for performing GIS data collector functions. Referring now to FIG. 6, additional components of storage and forwarding server 130 comprise a data dictionary forwarder 610, a data collector application forwarder 620, a data dictionary verifier 630, and a data dictionary feature selector 640 in embodiments of the present invention. Data dictionary forwarder 610 is for sending data dictionary 112 to mobile electronic device 110. In embodiments of the present invention, this may comprise data dictionary feature selector 640 accessing a larger set of feature type definitions (e.g., data dictionary 143a) stored upon database 134 and determining which of these have been selected for the workgroup to which mobile electronic device 110 has been assigned a membership. Data dictionary feature selector 640 then creates data dictionary 112 comprising those feature type definitions and/or attributes which have been selected and sends them to data dictionary forwarder 610 which forwards data dictionary 112 to mobile electronic device 110. In embodiments of the present invention, data dictionary forwarder 610 also formats data (e.g., data dictionary 112) prior to sending it to mobile electronic device 110 as described in greater detail below in Section VIII. Thus, in embodiments of the present invention, storage and forwarding server 130 may not store separate data dictionaries for each workgroup which has been identified by management application 141, but may instead assemble the discreet data dictionaries (e.g., 112) based upon the workgroup to which a particular mobile electronic device (e.g., 110) is assigned. However, in another embodiment, a plurality of data dictionaries 112 may be stored in database 134 which correspond to separate workgroups identified by management application 141.

In one embodiment, collector application forwarder 620 is for conveying data collector application 111 to mobile electronic device 110 which configures it to perform GIS data collector functions. For example, if provisioning is performed by storage and forwarding server 130, GIS data collector application 111 may be forwarded using collector application forwarder 620. In other embodiments, provisioning may be performed by a separate server (not shown) in response to a message from storage and forwarding server 130. In embodiments of the present invention, each time that communications are established between storage and forwarding server 130 and mobile electronic device 110, data collector application forwarder 620 determines whether the version of data collector application 111 resident upon mobile electronic device 110 is a current version. If it is determined that data collector application 111 is not current, data collector application forwarder 620 will automatically send the most recent version to mobile electronic device 110. In embodiments of the present invention, data collector application forwarder 620 can forward modified or new versions of data collector application 111 automatically as they become available.

Data dictionary verifier 630 is for determining which version of data dictionary 112 is resident upon mobile electronic device 110. In embodiments of the present invention, if a new, or updated version of data dictionary 112 is assigned to the workgroup to which mobile electronic device 110 is assigned, data dictionary verifier 630 will automatically compare the version number of the new or modified data dictionary with the data dictionary 112 resident upon mobile electronic device 110. In embodiments of the present invention, determining which version of data dictionary 112 is resident upon mobile electronic device 110 is performed automatically upon establishing communications with storage and forwarding server 130. In an embodiment of the present invention, this is performed in response to a query generated by GIS data collector application 111 regarding the recent version number of data dictionary 112. Thus, updating or replacing the data dictionary resident upon mobile electronic device 110 can be performed automatically upon establishing communications with storage and forwarding server 130, or during an ongoing communication session without necessitating user intervention. In embodiments of the present invention, if data dictionary verifier 630 determines that a modified data dictionary, or a new data dictionary, has been identified for mobile electronic device 110 (e.g., for the workgroup to which mobile electronic device 110 is assigned), GIS data collector application 111 automatically initiates a process wherein the modified data dictionary is sent to mobile electronic device 110. In another embodiment, data dictionary verifier 630 may automatically initiate the updating process wherein the modified data dictionary is sent to mobile electronic device 110. It is noted that this process is performed in a manner which is transparent to the user of mobile electronic device 110. In embodiments of the present invention, if mobile electronic device 110 is currently being used to collect GIS data, a message may be displayed informing the user that a new data dictionary (e.g., 112) is available. However, the new data dictionary will not be used until the user saves the GIS data currently being collected.

Data dictionary feature selector 640 is for identifying the GIS feature types, and associated attributes, which have been selected for a particular workgroup and creating a data dictionary (e.g., 112) from those features. It is appreciated that a data dictionary comprises, but is not limited to, at least one GIS feature type. Thus, data dictionary 112 typically comprises a subset of all the GIS feature types and associated attributes which comprise data dictionary 143*a*. For example, if data dictionary 143*a* comprises 10 GIS feature types, data dictionary feature selector 640 may select 5 of them which have been identified by the administrator of GIS data network 140 for use by the workgroup to which mobile electronic device 110 is a member. In one embodiment of the present invention, separate data dictionaries (e.g., 112) are not stored in database 134. Instead, the selected GIS features for a workgroup are copied into data dictionary 112 and sent to mobile electronic device 110 upon determining the workgroup to which mobile electronic device 110 is assigned. However, in another embodiment, separate data dictionaries 112 may be created upon determining which features and associated attributes have been selected for a particular workgroup and stored as discreet files in database 134.

When mobile electronic device 110 establishes communications, storage and forwarding server 130 will determine the version of data dictionary 112 resident upon mobile electronic device 110 and, if a data dictionary is resident upon mobile electronic device 110, the version of that data dictionary using data dictionary verifier 630. In one embodiment, this is performed in response to a query generated by GIS data collector application 111. In embodiments of the present invention, this comprises identifying the particular mobile electronic device, identifying the workgroup to which that device is assigned, and determining which data dictionary has been selected for that workgroup. In embodiments of the present invention, if no data dictionary is resident upon mobile electronic device 110, storage and forwarding server 110 accesses database 134, determines what feature types have been selected for the workgroup to which mobile electronic device 110 is assigned, and creates data dictionary 112 which comprises the selected feature types. Storage and forwarding server 130 then automatically sends data dictionary 112 to mobile electronic device 110 where it is stored.

Storing Collected GIS Data

In embodiments of the present invention, storage and forwarding server 130 stores the collected GIS features/attributes until they are downloaded onto GIS data network 140.

In embodiments of the present invention, when a user collects feature/attribute data using mobile electronic device 110 and saves it, the data is automatically sent to storage and forwarding server 130 via wireless network 120. In embodiments of the present invention, if communications are not yet established, or interrupted, the collected feature/attribute data is stored on mobile electronic device 110 until communications are established with storage and forwarding server 130. When communications are again established, mobile electronic device 110 will automatically send the stored data to storage and forwarding server 130.

When feature and attribute data is sent from GIS data collector application 110, it is typically formatted as an Extensible Markup Language (XML) file. This is advantageous in that the data dictionary data stored in database 134 is also formatted to be compliant with the XML format. In embodiments of the present invention, when the feature/attribute data is sent by mobile electronic device 110, it is received by phone service 131 which serves as an interface between storage and forwarding server 130 and wireless network 120. In embodiments of the present invention, phone service 131 may also serve to authenticate that mobile electronic device 110 currently has a valid account with wireless network 120. The feature/attribute data is then sent to message queue 132 which ensures that feature/attribute data sent by GIS data collector application 111 is secure on storage and forwarding server 130. Feature inserter 133 encrypts and stores the attribute/feature data on database 134. In embodiments of the present invention, feature inserter 133 utilizes 256-bit Rijndael method encryption prior to inserting the feature/attribute data collected by mobile electronic device 110 onto database 134.

In embodiments of the present invention, upon successfully storing the new feature/attribute data in database 134, storage and forwarding server 130 returns a confirmation message to mobile electronic device 110. Upon receiving the confirmation message, mobile electronic device 110 may automatically erase or delete the feature/attribute data from non-volatile memory 203 or volatile memory 204. Alternatively, as discussed above, the collected GIS data may be marked as "Transferred" and stored on mobile electronic device 110 for future reference.

Forwarding Collected GIS Data

In embodiments of the present invention, storage and forwarding server 130 stores the collected GIS features/attributes until they are downloaded onto GIS data network 140. In the present embodiment, storage and forwarding server 130 archives the collected GIS features/attributes which have been downloaded onto GIS data network 140. In another embodiment of the present invention, in response to a message from GIS data network 140 that the data has been successfully downloaded, storage and forwarding server 130 may delete the collected feature/attribute data from database 134.

In embodiments of the present invention, feature web service 136 facilitates retrieving data stored in database 134 and downloading it to feature management application 141*b* of GIS data network 140 as well as performing the decryption of the data prior to sending it to GIS data network 140. In the present embodiment, GIS data network 140 sets a polling interval which determines how often feature management application 141*b* queries whether new feature/attribute data has been stored on database 134. In another embodiment of the present invention, when an account is created for GIS data network 140 a parameter may be set which determines how often storage and forwarding server will generate a message to GIS data network 140 that new data is available. For example, storage and forwarding server may be configured to generate a message to GIS data network 140 every time new feature/attribute data has been stored in database 134 from one of the mobile electronic devices registered to its account. Alternatively, storage and forwarding server 130 may periodically check (e.g., daily, weekly, etc.) to determine whether new feature/attribute data has been stored in database 134 from one of the mobile electronic devices registered to the account of GIS data network 140.

In embodiments of the present invention, storage and forwarding server 130 forwards the new feature/attribute data to GIS data network in response to a message therefrom requesting the new data. In embodiments of the present invention, storage and forwarding server may automatically retain that data locally for a pre-determined period (e.g., one month) prior to deleting the data, or may archive the data for GIS data network 140. Alternatively, in response to a confirmation message from GIS data network 140 which indicates that the new feature/attribute data has successfully been stored (e.g., in database 142), storage and forwarding server 130 may automatically delete that data from database 134.

In embodiments of the present invention, post processing of the collected feature/attribute data may be performed by storage and forwarding server 130 prior to forwarding it to GIS data network 140. For example, if the feature being collected is a point feature, a weighted average of the position fixes of the attribute may be performed by storage and forwarding server 130. Alternatively, a straight average may be performed on that data. Additionally, embodiments of the present invention may apply differential GPS corrections to position fixes performed by mobile electronic device 110.

In embodiments of the present invention, a Simple Object Access Protocol (SOAP) header with authentication data (e.g., account name and password) is required to access the feature/attribute data from database 134. In embodiments of the present invention, feature web service 136 will provide the following methods for accessing data:

public string GetFeatures(int maxFeatures, out int featuresReturned)—get all available features for a given account, up to maxFeatures (or up to Service's maxFeatureThreshold, whichever is smaller). Will return a number of features and a XML string containing FDML description of features found. If an error is encountered it will return a XML string containing an error description.

public string Delete Features(int number Of Features, Int64[ ] features To Delete)—delete features specified in the given parameters (but only if valid for the specified account). Will return a confirmation string or an error description as a XML string.

public string Get Schema(string schema Timestamp)—will return a DDML string for a specified data dictionary (for a given account). If the input parameter is empty it will return the current dictionary. If an error is encountered it will return a XML string containing an error description.

public string Get Feature Count( )—will return a string containing a number of available features for a given account. If an error is encountered it will return a XML string containing an error description.

Thus, storage and forwarding server 130 facilitates implementing a GIS data collecting network for smaller entities which may not have the resources to deploy conventional dedicated GIS data collectors as well as the storage and processing resources for collected GIS data. Specifically, storage and forwarding server 130 may be implemented by a service provider. Thus, smaller entities would only be responsible for the cost of mobile electronic devices (e.g., 110) and the respective accounts for each of these devices with wireless network 120. Alternatively, in larger entities, it may be more desirable to implement storage and forwarding server 130 as an integrated component of GIS data network 140 as an added data security precaution. Storage and forwarding server 130 is not limited to use with legacy handheld mobile electronic devices and may also be implemented by networks which do use dedicated GIS data collectors as well.

Figure 7:
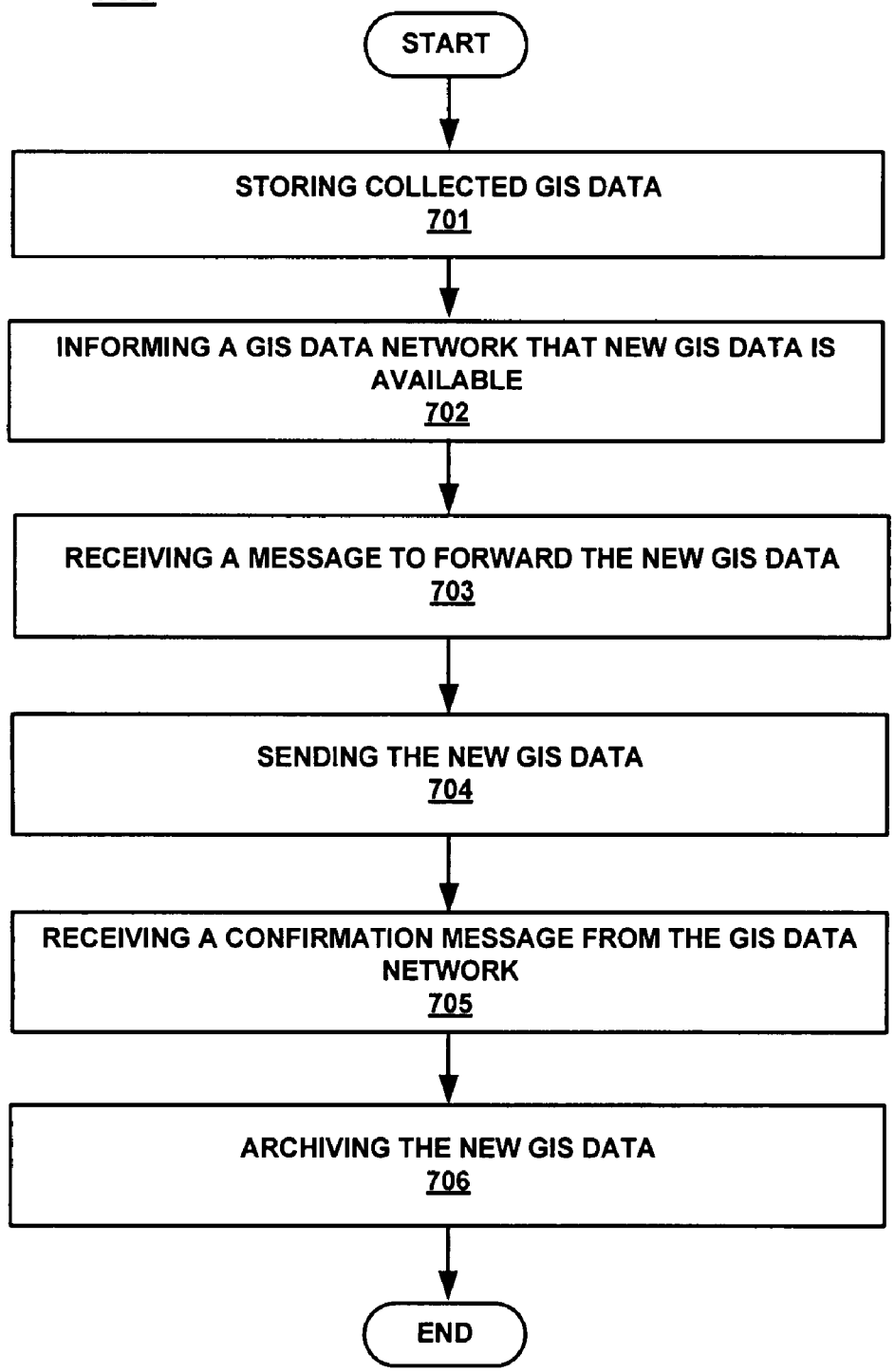
FIG. 7 is a flowchart of a method for forwarding GIS data in accordance with embodiments of the present invention.

FIG. 7 is a flowchart of a method 700 for forwarding GIS data from storage and forwarding server 130 in accordance with embodiments of the present invention. In step 701 of FIG. 7, collected GIS data is stored. In embodiments of the present invention, when data is saved by the user of mobile electronic device, it is automatically sent to storage and forwarding server 130. In embodiments of the present invention, this new GIS data is encrypted prior to storing on database 134.

In step 702 of FIG. 7, a GIS data network is informed that new GIS data is available. In one embodiment of the present invention, a message is sent by storage and forwarding server 130 to GIS data network 140 when new GIS data is available for forwarding. In embodiments of the present invention, this message may be sent immediately upon storing the new GIS data in database 134, or according to a pre-set time parameter (e.g., hourly, daily, weekly, etc.). Alternatively, in response to a query from GIS data network 140, storage and forwarding server 130 may send a message which states that new GIS data is available.

In step 703 of FIG. 7, a message is received to forward the new GIS data. In response to step 703 above, GIS data network 140 sends a message to storage and forwarding server 130 which initiates downloading the new GIS data.

In step 704 of FIG. 7, the new GIS data is sent to GIS data network 140.

In step 705 of FIG. 7, a confirmation message is received from the GIS data network. In embodiments of the present invention, upon successfully storing the new GIS data, GIS data network 140 sends a confirmation message to storage and forwarding server 130.

In step 706 of FIG. 7, the new GIS data is archived. In response to the confirmation message from GIS data network 140, the new GIS data is archived in database 134 for a pre-determined period (e.g., a week, a month, etc.) to permit GIS data network 140 to retrieve the new GIS data if it becomes lost, deleted, or otherwise inaccessible. Alternatively, the new GIS data may be deleted in response to the confirmation message.

Figure 11:
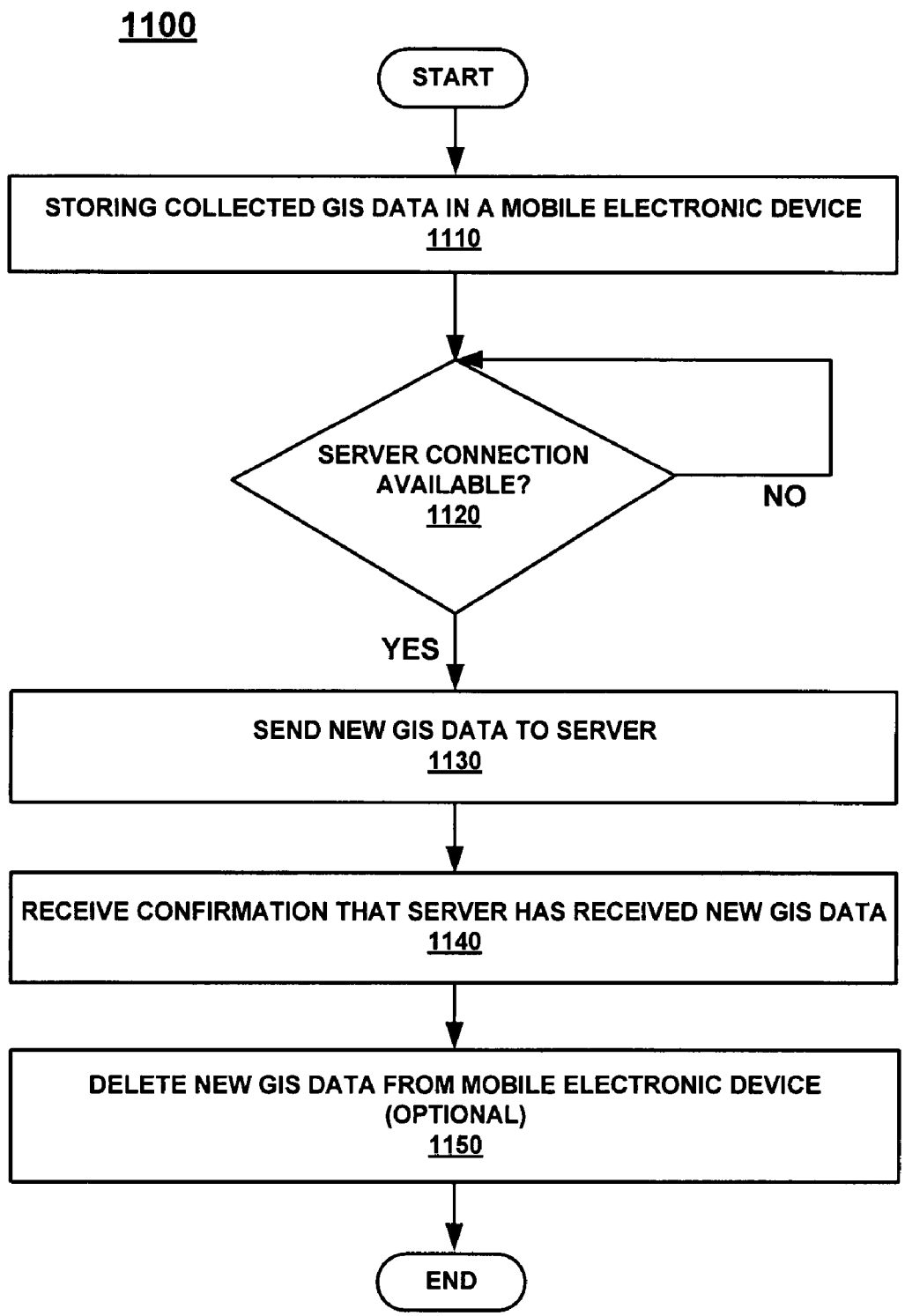
FIG. 11 is a flowchart of a method for forwarding collected GIS data from a mobile electronic device in accordance with embodiments of the present invention.

FIG. 11 is a flowchart of a method 1100 for forwarding collected GIS data from a mobile electronic device in accordance with embodiments of the present invention. In step 1110 of FIG. 11, collected GIS data is stored in a mobile electronic device. As described above, when the user of mobile electronic device 110 presses the "Save" button, the collected GIS data is automatically saved in a memory device of mobile electronic device 110.

In step 1120, a logical operation is performed to determine whether a server connection is available. In embodiments of the present invention, GIS data collector application 111 determines whether a connection with storage and forwarding server 130 is available. In the present embodiment, if a connection with storage and forwarding server 130 is not available, method 1100 returns to step 1120. If a connection with storage and forwarding server 130 is available, method 1100 proceeds to step 1130.

In step 1130 of FIG. 11, new GIS data is sent to the server. In embodiments of the present invention, if a connection with storage and forwarding server 130 is available, mobile electronic device 110 automatically sends the collected GIS data. Again, the user of mobile electronic device 110 does not require any specialized training for this to occur as it is performed automatically by GIS data collector application 111.

In step 1140, confirmation that the server has received the new GIS data is received. In embodiments of the present invention, when the collected GIS data has been successfully stored in storage and forwarding server 130 (e.g., in database 134), a message is generated which is sent to mobile electronic device 110.

In optional step 1150 of FIG. 11, the new GIS data is deleted from the mobile electronic device. In embodiments of the present invention, upon receiving the confirmation from storage and forwarding server 130, GIS data collector application 111 automatically deletes the collected GIS data from mobile electronic device 110. Alternatively, the collected data may be automatically marked as "Transferred" in response to receiving the confirmation message. Thus, the user is again relieved from having to manage collected GIS data on mobile electronic device 110.

Section VII

Management Application

In embodiments of the present invention, management suite 141 comprises a web browser based database management application (e.g., web browser 141a of FIG. 1) and a feature management application 141b. In embodiments of the present invention, web browser 141a interacts with administrative website 135 of storage and forwarding server 130 to, for example, establish an account for GIS data network 140, create and modify data dictionaries (e.g., data dictionary 112), manage mobile electronic device 110, create workgroups, and assign mobile electronic device 110 to a workgroup. The administrator accesses the management application using a unique login/password and adds each deployed mobile electronic device (e.g., 110) to the account established with storage and forwarding server 130. The administrator also controls the workgroup to which a particular mobile electronic device is assigned, what data dictionary (e.g., 112) is assigned to a workgroup, and the contents of that data dictionary.

In embodiments of the present invention, if the administrator has not yet established an account for GIS data network 140, they can access a "New Account" section and register with storage and forwarding server 130 using web browser 141a. In embodiments of the present invention, upon receiving the account registration, storage and forwarding server 130 sends an e-mail to the administrator providing the account name and a temporary password for the account. The administrator can then access their account and change the password.

Management of Mobile Electronic Devices

In embodiments of the present invention the administrator also uses web browser 141a to add (e.g., register) each mobile electronic device 110 with the account established with storage and forwarding server 130. Web browser 141a can also be used to edit the registration information of a mobile electronic device, or to delete the mobile electronic device from the account of GIS data network 140. As an example, the administrator may register a phone number assigned to mobile electronic device 110, a description of mobile electronic device 110, first and last name of the user of mobile electronic device 110, and the International Mobile Equipment Identification (IMEI) number of mobile electronic device 110 to the account. In embodiments of the present invention, once a mobile electronic device is registered to the account of GIS data network 140 it can be assigned to a workgroup. Alternatively, this information may be provided when registering the mobile electronic device to the account. Typically, if the administrator does not assign a workgroup to the mobile electronic device, it defaults to the default workgroup.

In embodiments of the present invention, web browser 141a can also access a spreadsheet via administrative website 135 containing the following columns:
Phone Number,
Description,
Workgroup,
Current Data Dictionary (yes/no),
Last Collected (date).

The Last Collected refers to the last time that entry sent features back from the phone to storage and forwarding server 130.

In embodiments of the present invention, the registration information of each mobile electronic device (e.g., 110) is stored in database 134 when the administrator registers the device. If the administrator needs to edit a particular entry of a particular mobile electronic device (e.g., 110), they can select the "Edit" function. The previously stored account information of mobile electronic device 110 will be displayed and the administrator can edit the data fields.

Workgroup Management

The workgroups tab contains all administrator control over what mobile electronic device (e.g., 110) correspond to one another, and what feature types can be reported by the mobile electronic devices of a particular workgroup. Once a group of feature types has been assigned to a particular workgroup, the feature types are automatically sent to the mobile electronic devices assigned to that workgroup.

In embodiments of the present invention, web browser 141a will display a drop-down box listing all created workgroups. Until the administrator creates a new workgroup, the only workgroup will be the default workgroup. The default workgroup contains all feature types in the data dictionary (e.g., data dictionary 143a). The administrator cannot remove any feature types from the data dictionary of the default workgroup. However, if new feature types are added to the data dictionary (e.g., data dictionary 143a), they are automatically added to the default workgroup. If a handset is removed from a defined workgroup, it is automatically reassigned to the default workgroup.

To create a new workgroup, the administrator clicks the Create New Workgroup button and then types in the workgroup name. To delete a workgroup, the administrator selects it from the drop-down list and then clicks the Delete Workgroup button. The administrator is not permitted to delete the default workgroup.

Once a workgroup is selected in the drop-down list, there are controls to add features and mobile electronic devices (e.g., 110) below the drop-down. One list displays features and has promote/demote buttons for ordering the features within the list; the handset list is set to the right of the feature types list (and lists all of the mobile electronic devices which are registered to the account of GIS data network 140). There are Add and Remove buttons below both lists. Clicking the Add button brings up a new page with either the list of feature types from the data dictionary tab or the handsets tab, depending on what Add button the administrator clicked.

In embodiments of the present invention, the user of mobile electronic device cannot control which data dictionary (e.g., 112) they use or when to start using it. Instead, in embodiments of the present invention, this is entirely controlled by the administrator of GIS data network 140. If the user of mobile electronic device 110 receives a new data dictionary, or an update thereof, while collecting attribute data about a feature, the new data dictionary takes effect the next time the user goes to the Collect Data screen (e.g., 402 of FIG. 4A). Any feature in progress is completed and stored before the new data dictionary takes effect.

Data Dictionary Creation and Modification

Data dictionary creation is one function of management application 141. Thus, in embodiments of the present invention, management application 141 supports:
New feature type creation including;
Feature name
Geometry type (point, line, polygon)
Addition of attributes to feature
Importing existing data dictionary/schema
Editing existing data dictionary/schema In embodiments of the present invention, there is only one data dictionary per account which is imported onto database 134 of storage and forwarding server 130. Once the account for GIS data network 140 is created, workgroups are constructed which define a particular group of handsets (e.g., mobile electronic device 110). Based upon the workgroup to which a handset is assigned, all of the feature types, or a subset thereof, comprising the data dictionary stored on storage and forwarding server 130 are forwarded to the handset as data dictionary 112.

The data dictionary section of the web page is accessed via the Data Dictionary tab. Two sub-tabs, "Edit" and "Import", help direct the administrator to the appropriate tools for their data dictionary management. The administrator uses these tabs to create subsets of schema which comprise the data dictionaries (e.g., 112) which are associated with particular workgroups. For example, to create data dictionary 112, the administrator may import an existing data dictionary (DDF 143) from database 142 onto storage and forwarding server 130, into database 134. In embodiments of the present invention, when a data dictionary (e.g., data dictionary 143*a*) is saved to database 134, it is converted to the XML format.

All actions on either sub-tab, Edit or Import, will be automatically saved to the database (e.g., 134 and/or 142) so the administrator will not lose their work. It will not be sent to phones until the administrator performs an explicit function, being pressing the "Publish" button on the page. Once the administrator presses "Publish" they are sent to another page asking them to the Please Confirm that they want to publish the changes they made. "Yes" commits the changes to the global data dictionary and also pushes changes out to the workgroups. "No" brings the administrator back to the main data dictionary page with same choices.

The other main control button on this page is the "Discard Changes" button. If the administrator clicks on it, it will bring them to another page asking user if they want to roll the data dictionary back to the last time changes were published and also shows them the specific date associated with that data dictionary for reference. They must choose Yes or No.

If there have been changes made to the data dictionary that have not yet been published, a message will be displayed on the data dictionary page to make the administrator aware of this.

Importing Data Dictionaries

In embodiments of the present invention, administrators can import an existing data dictionary (e.g., DDF 143 of FIG. 1) onto database 134 of storage and forwarding server 130. Once the import is complete, the web page displayed by management application 141 will automatically switch to the 'Edit' sub-tab so the administrator can edit or delete feature types or create new feature types that were not present in the original DDF file and are stored in data dictionary 143*a*.

In embodiments of the present invention, any edits that are made to a schema (data dictionary) will trickle down to workgroups (sub-schemas) automatically. The administrator is not required to do anything to make these changes seen to the field worker. Since names of feature types and attributes must be unique, embodiments of the present invention may automatically modify the names of imported feature types and attributes to ensure uniqueness.

Editing Data Dictionaries

The edit functionality of management application allows an administrator to create a new feature type (point, line or polygon) and add attributes to that feature type (see attributes section below). In embodiments of the present invention, the administrator creates a new feature type by clicking a 'New' button of the interface of management application 141. This pops-up a new page where the administrator enters information: feature name, whether it is a point, line, or polygonal feature geometry type, and attribute information (see attributes section below).

Once the administrator is finished entering all necessary information, they press the Save Changes button, or the Save Changes and Add Another Feature button. The Save Changes button saves all changes and returns the administrator to the main page. The Save Changes and Add Another Feature button saves all changes and clears the feature page, so they are able to add details for a new feature type.

The feature types added to the data dictionary will typically be organized alphabetically. The administrator may then choose any feature type in the list and edit it by clicking the 'edit' button or delete it by clicking the 'delete' button. These buttons are located both at the top right and bottom right of the page.

In embodiments of the present invention, prior to sending data dictionaries to storage and forwarding server 130, or edits made thereto, the data dictionary is reformatted to be compliant with the XML specification.

Additionally, in embodiments of the present invention, DDXML "prompt" values for attributes and menu items are not set when importing DDF files. Prompts may be left empty, which means the phone will use the name of the attribute or menu item as the prompt.

Data Dictionary Attributes

In embodiments of the present invention, management application 141 provides the capability to configure a data dictionary with the following attribute formats:
Menu
Text
Numeric
Date
Photo (filename)

The New/Edit Feature page is where the initial attribute controls lie. In one embodiment, this consists of a listbox, which lists all created attributes for a particular feature. Promote/demote buttons give the administrator control over the attribute order within the listbox. The buttons "New", "Edit", "Delete", and "Set As Label" are situated below the listbox.

As an example, the administrator creates a new attribute by clicking the "New" button. This pops-up a new page where the administrator enters attribute information: attribute name (e.g., a textbox), attribute prompt (e.g., a textbox), attribute type (e.g., a radio button with list of types: menu, text, number, date, photo), a "value is required" checkbox (which indicates an attribute that is required in order for the user of mobile electronic device 110 to save collected data), and attribute information. The section of page below the "value is required" checkbox is dynamic and depends on the attribute type selected by the administrator. Nothing is displayed until a type has been selected.

If the menu type is selected, this section changes to enable the administrator to add menu items. This is done by entering in a prompt (name that field user will see) and an associated value(s) and then pressing the Add to List button (located on the right side of the textbox). The prompt and value are then moved down to the listbox for display and are able to be deleted and promoted/demoted if selected. If the administrator wants to designate a particular menu item as default, they must follow the following steps: administrator selects an item in the list and then clicks "Set As Default" button. A default symbol will then display on the left of the listbox next to the designated item. The "Set As Default" button will only be enabled if one attribute is selected.

If the text type is selected, this section changes to enable the administrator to add a text attribute. The administrator must specify the maximum length of the text field and a default string, if valid (null is acceptable).

If the number type is selected, this section changes to enable the administrator to add a number attribute. There are four textboxes which will define the number allowed in the field. First, a decimal places textbox asks for the number of decimal places allowed; the default value is zero. Minimum and maximum textboxes allow the administrator to enter a minimum and maximum inclusive value, thus creating a legal range of values that the field user is able to enter. Finally, a default textbox is available for the administrator to enter in a default attribute value.

If the date type is selected, this section changes to enable the administrator to add date items. An auto-generate checkbox and format radio are displayed. The available formats are: Date, or Date and Time.

If the photo type is selected, this section changes to display text informing the administrator that they just need to press Save Changes to save a photo attribute. It may be desirable to associate more than one photo per feature. Since more than one filename per attribute does not make sense in the GIS space, management application 141 will allow the administrator to create more than one photo attribute for each file they want to attach to the feature.

Once the administrator is finished entering all necessary information, they press the "Save Changes" button or the "Save Changes and Add Another Attribute" button. The "Save Changes" button saves all changes and returns the administrator to the New/Edit Feature page. The "Save Changes and Add Another Attribute" button saves all changes and clears the attribute page, so they are able to add details for a new attribute.

Many times a field user may want/need more information about a particular attribute that the name will not provide. The obvious example is an attribute with a particular unit of measure as a value (such as "height"). It may be necessary for the administrator to inform the field user of the units for accurate value recording. In embodiments of the present invention, a prompt will allow the administrator to keep a name of an attribute such that it will work within their database/GIS (Name: 'height'), however inform the field user that the units are in meters (Prompt: 'height (m)').

Another useful feature of management application 141 facilitates labeling an attribute in the field. Labeled attribute types are used to identify features on the map. For example, a text label is drawn beside the symbol for each feature on a map. In embodiments of the present invention, if the administrator chooses, this can be achieved in the web page of management application 141 by the following steps: the administrator selects an attribute in the list and then clicks "Set As Label" button. A label symbol will then display on the left of the listbox next to the designated attribute. The "Set As Label" button will be enabled if one attribute is selected. There may be restrictions on the length of the text that is shown in the Field Application. Typically, the default label field is the first attribute for a feature.

In embodiments of the present invention, management application is also for controlling the transfer of collected feature/attribute data from storage and forwarding server 130. For example, when collected feature/attribute data is stored in database 134, a message may be generated which informs GIS data network 140 that new data is available. In embodiments of the present invention, this message may be sent as soon as the data is stored in database 134, or at some regular interval (e.g., daily). In embodiments of the present invention, these parameters are controlled by the administrator of GIS data network 140 using management application 141. In the present embodiment, feature management application 141*b* may be configured with a polling interval in which a query is periodically sent by feature management application 141*b* to storage and forwarding server 130 as to whether new data is available. Thus, near real-time notification, or downloading, of new data can be made available to GIS data network 140. This is especially important for emergency response organizations.

In embodiments of the present invention, when the feature/attribute data is successfully downloaded onto GIS data network 140, management application 141 generates a confirmation to storage and forwarding server 130. In response to this confirmation, storage and forwarding server 130 may immediately delete, or archive the feature/attribute data, or store it for a pre-determined time period. Again, theses parameters can be controlled by the administrator using web browser 141*a*.

In embodiments of the present invention, feature management application 141*b* can save the collected feature/attribute data to GIS data network 140 in a variety of formats such as the Geographic Markup Language (GML) as well as image files of various formats (e.g., Joint Photographic Experts Group (JPEG) files).

Figure 8:
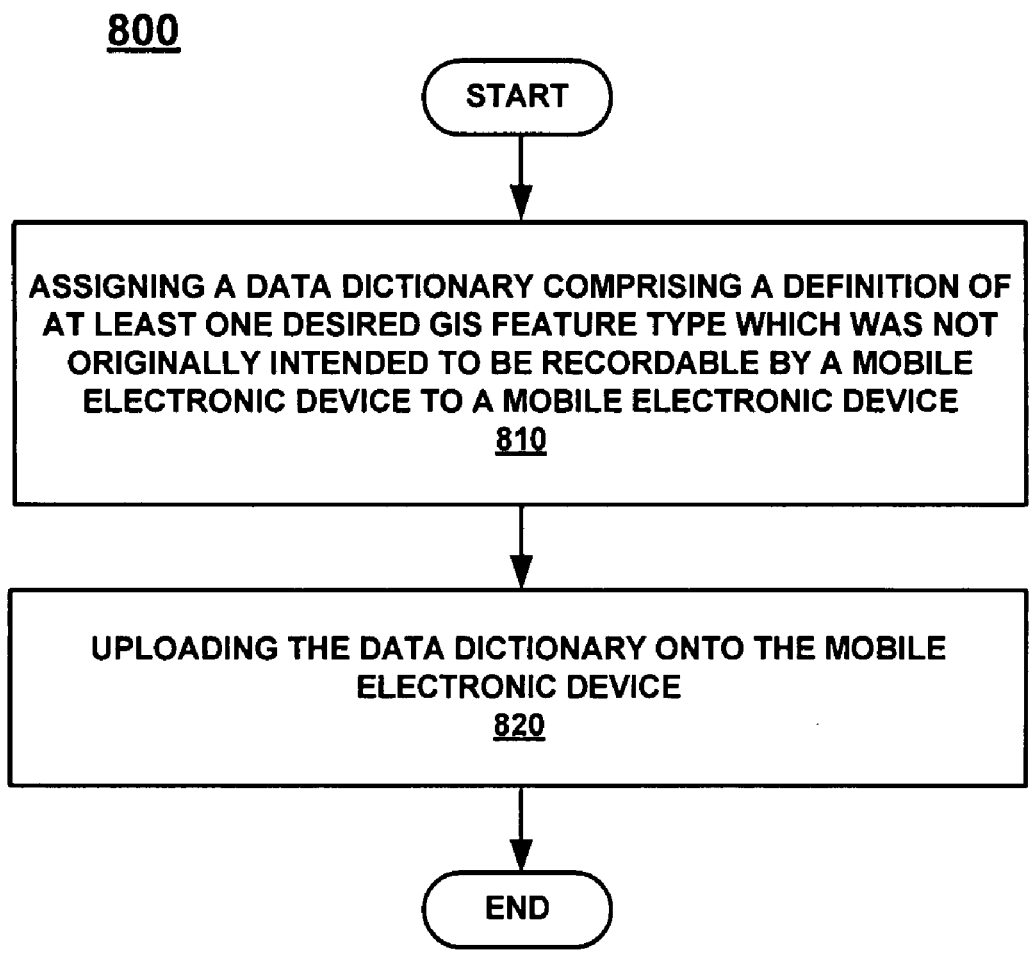
FIG. 8 is a flowchart of a method for creating a flexible GIS network in accordance with embodiments of the present invention.

FIG. 8 is a flowchart of a method 800 for creating a flexible GIS network in accordance with embodiments of the present invention. In step 810 of FIG. 8, a data dictionary, comprising a definition of at least one desired GIS feature type, is assigned to a mobile electronic device. In embodiments of the present invention, a flexible GIS data collection network can be created by selecting GIS feature type definitions for a mobile electronic device which were not originally intended to be recordable by that mobile electronic device. In so doing, the GIS data collection network can be quickly reconfigured to collect data on an ad-hoc basis due to changing conditions such as natural disasters. For example, if mobile electronic device is utilizing a data dictionary (e.g., 112) comprising features/attributes used to report utility pole conditions, it can be assigned a new or modified data dictionary 112 which can be used to report which roads are blocked as a result of a major storm. This information can then be used to route emergency services around blocked roads.

In step 820 of FIG. 8, the data dictionary is uploaded onto the mobile electronic device. In so doing, mobile electronic device 110 is reconfigured to permit collecting GIS data which it was not originally intended to collect. The ability to rapidly reconfigure mobile electronic devices to perform GIS data collector functions, as well as the ability to reconfigure pre-defined data dictionaries, permits using embodiments of the present invention with a variety of legacy mobile electronic devices which were not originally designed to perform these functions. This in turn can reduce the cost of deploying a GIS data collection network.

FIG. 9 is a flowchart of another method 900 for creating a flexible GIS network in accordance with embodiments of the present invention. In step 901 of FIG. 9, an assigned membership of a mobile electronic device to a workgroup is determined.

In step 902 of FIG. 9, a data dictionary resident upon the mobile electronic device and comprising at least one GIS feature type, is determined. As described above, an administrator of GIS data network 140 assigns mobile electronic device 110 to a workgroup and also assigns a data dictionary to that workgroup. Thus, the features/attribute definitions comprising data dictionary 112 are selected based upon the workgroup to which mobile electronic device 110 is assigned.

In step 903 of FIG. 9, a request is received for a second data dictionary comprising at least one desired GIS feature type which was not originally intended for the workgroup. As described above, each workgroup is assigned a data dictionary which defines which GIS features/attributes can be recorded by that workgroup. For example, a workgroup which is tasked with recording utility pole data will not be assigned a data dictionary which permits recording road conditions. As described above, in response to changing conditions in the field such as an emergency, a user of mobile electronic device 110 may contact the administrator of GIS data network 140 and request a second data dictionary (e.g., a new or modified data dictionary). The user will then describe the desired GIS features/attributes (e.g., road conditions) which are needed in order to record the GIS data. Alternatively, in response to an emergency, the administrator of GIS data network 140 may change the data dictionaries for deployed workgroups without any input from the users in the field.

In step 904 of FIG. 9, the second data dictionary is sent to the mobile electronic device. Upon receiving the second data dictionary, mobile electronic device 110 is configured to collect GIS data about features/attributes which were not originally intended for that workgroup.

Figure 10:
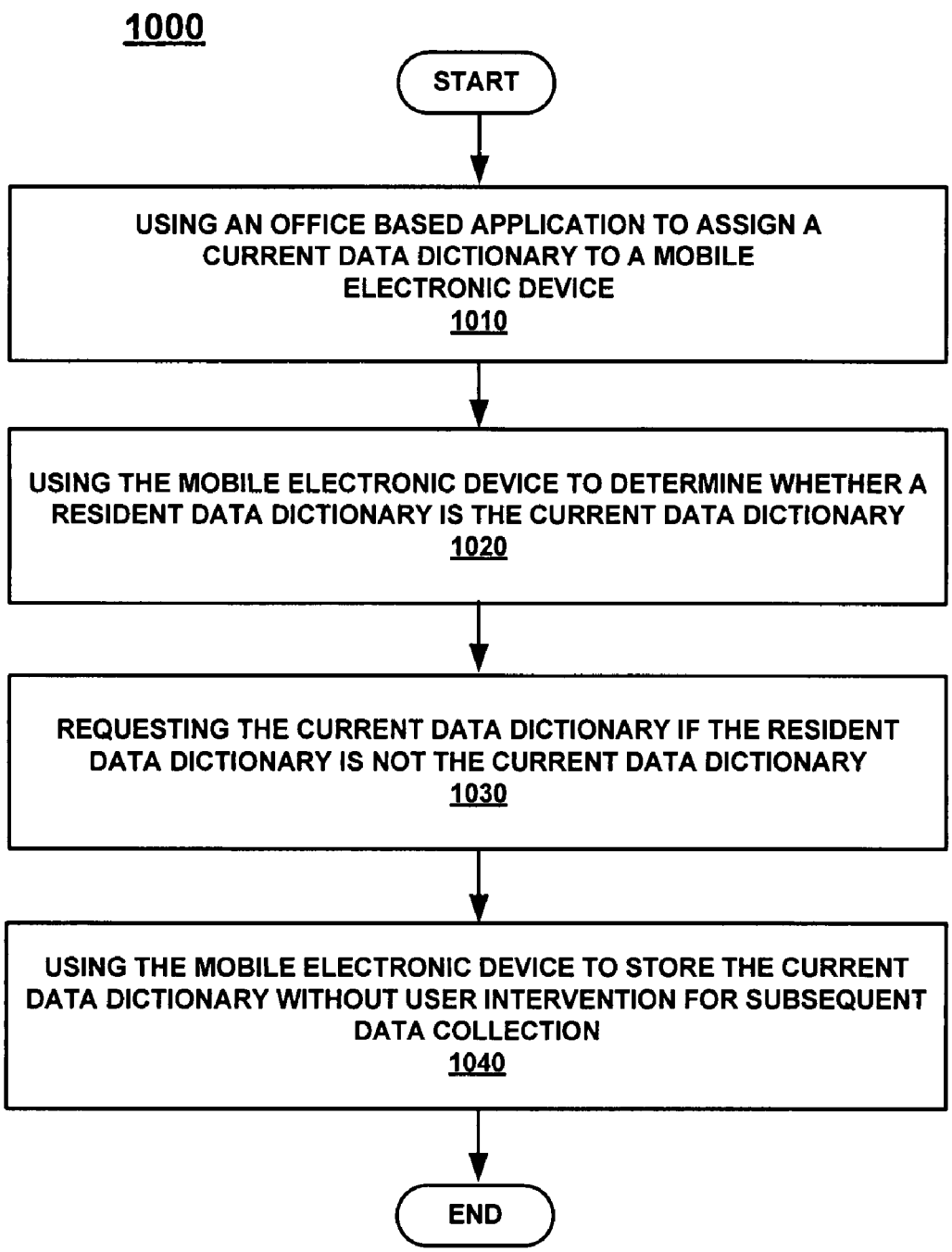
FIG. 10 is a flowchart of a method for forwarding a data dictionary in accordance with embodiments of the present invention.

FIG. 10 is a flowchart of a method 1000 for forwarding a data dictionary in accordance with embodiments of the present invention. With reference to step 1010 of FIG. 10, an office based application is used to assign a current data dictionary to a mobile electronic device. As described above, in embodiments of the present invention web browser 141a is used to assign a current data dictionary to mobile electronic device 110. In embodiments of the present invention, this may comprise creating a new data dictionary, or modifying an existing data dictionary, for mobile electronic device 110.

In step 1020 of FIG. 10, the mobile electronic device is used to determine whether a resident data dictionary is the current data dictionary. In embodiments of the present invention, GIS data collector application 111 may determine the version of data dictionary 112 which is resident upon mobile electronic device 110. In one embodiment, this version number is sent to storage and forwarding server 130. In another embodiment, GIS data collector application 111 may query storage and forwarding server 130 to determine the most recent version of data dictionary 112 and compare that version with the version resident upon mobile electronic device 110.

In step 1030 of FIG. 10, the current data dictionary is requested if the resident data dictionary is not the current data dictionary. In one embodiment of the present invention, if GIS data collector application 111 determines that the current data dictionary is a newer version than the version resident upon mobile electronic device 110, it may generate a request for the current data dictionary. In the current embodiment, storage and forwarding server 130 determines the version of data dictionary 112 resident upon mobile electronic device 110 and automatically sends the current version if it is more recent than the version resident upon mobile electronic device 110.

In step 1040 of FIG. 10, the mobile electronic device is used to store the current data dictionary without user intervention for subsequent data collection. In embodiments of the present invention, the current data dictionary is uploaded without the need for user intervention. As a result, the necessity for training the user of mobile electronic device 110 to manage collected GIS data, or versions of GIS data collector application 111 and/or data dictionary 112. Additionally, if the user of mobile electronic device 110 is a first time, occasional, user of the GIS data collection functionality, the user may not remember to update data dictionary 112 prior to collecting GIS data. However, embodiments of the present invention perform updating of data dictionaries in a manner that is transparent to the user such that the most current data dictionary is readily available.

Section VIII

Delivering Tailored Asset Information to a Device

Overview

In general, embodiments of the present invention can also deliver information to a device in a user defined dashboard format tailored to a specific device. The term dashboard refers to a viewable display that provides information in a format similar to that of a vehicle. For example, in a vehicle a driver may monitor speed, RPM, oil temperature, and the like. In the same manner, a worksite manager may wish to monitor worksite metrics such as costs, asset utilization, manpower, safety, diversity, environmental concerns, and the like.

The dashboard provides one exemplary method for displaying any or all of the desired worksite metrics in a quickto-comprehend overview type format. Moreover, in one embodiment, when interacting with the dashboard, the user may select one of the metrics, e.g., costs, which will then invoke a more in-detail dashboard view of the information behind the costs metric. For example, costs metric may include, labor, materials, fines, delays, savings, etc. In one embodiment, the layers of depth of the dashboard are limited only by the availability of asset data.

Basically, the present technology provides a data delivery system for presentation on a display of a computing device, e.g., mobile phone, personal digital assistant, laptop, etc. In one embodiment, the data is mined from a database such as database 134 of FIG. 1 and includes, for example, a status report for aspects of a worksite or job.

In one embodiment, the display results are pre-determined or selected based on user-chosen fields in a setup menu and are easily adjustable per job, per level, per time period and the like. In one embodiment, the display results are selected by the administrator of GIS data network 140 via web browser 141. Alternatively, the setup may be assessable from any Internet access device and may be adjusted via dropdown menus or may be custom tailored. In one embodiment, the dashboard may be a hardwired view (e.g., providing access to the data via the device and allowing the device to format the incoming data to establish the dashboard view). However, the present technology is also well suited to allowing the device to have the option of utilizing a web view instead of a hard-wired view. Basically, web view means that there is no need for the device's internal software to do any formatting. The formatting comes with the downloaded data from the web access. Thus, by allowing the web view to also be formatted in a pre-defined manner there is no more extraneous 'stuff' on the web view than there is on the user defined display. In so doing, embodiments of the present invention avoid the loading delay associated with most commercial web browsers by utilizing a customized pre-selected view to speed downloading.

Figure 12:
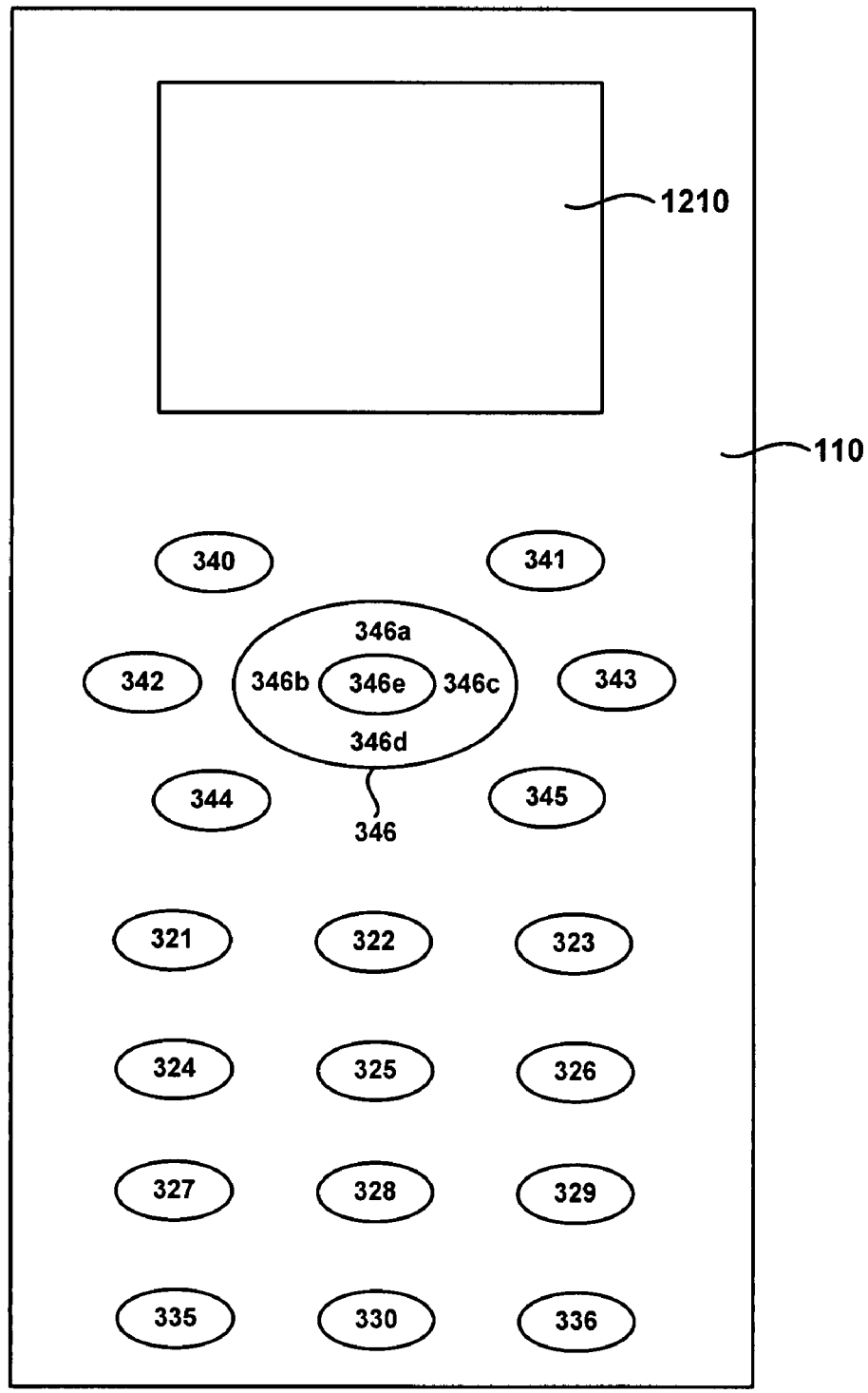
FIG. 12 is a block diagram of an exemplary mobile electronic device in accordance with embodiments of the present invention.

With reference now to FIG. 12, a block diagram of an exemplary mobile electronic device 110 is shown in accordance with one embodiment of the present invention. In one embodiment, mobile electronic device 110 includes a GUI 1212 and interactive buttons 5320. In general, mobile electronic device 110 is a device such as, but not limited to, a personal digital assistant (PDA), a mobile telephone, a pager, hand portable computing device, and the like.

In one embodiment, the size of GUI 1210 of mobile electronic device 110 is also known. In one embodiment, the size is provided in a measurement of the pixel area of GUI 1210. However, the present technology is well suited to providing the size of GUI 1210 in other measurements such as length, width, diagonal measure, dots per inch (DPI) and the like.

With reference now to FIG. 13A, a block diagram of an exemplary listing 1300 of top level worksite related user selectable options 1310 for defining a GUI dashboard is shown in accordance with one embodiment of the present invention. In one embodiment, the worksite related user selectable options 1310 include worksites 1322 and assets 1324. In one embodiment, worksites 1322 refers to sites or regions previously identified by a user of mobile electronic device 110 or the administrator of GIS data network 140 for data collection. Assets 1324 refers to specific assets which may be currently monitored in GIS data network 140.

Although a plurality of worksite related user selectable options 1310 are provided herein, they are exemplary. That is, the present technology is well suited to more, or fewer, worksite related user selectable options 1310. Moreover, the present technology is well suited to different worksite related user selectable options 1310 than those shown in FIG. 13A. The use of the provided worksite related user selectable options 1310 herein is merely for purposes of brevity and clarity.

Furthermore, worksite related user selectable options 1310 may be provided or limited based on the size of the GUI of the device that will be displaying the information. For example, a user may initially be defining a dashboard for a handheld device such as mobile electronic device 110 of FIG. 1. As such, the user would input the device type to receive the information. For example, the user may select a mobile phone with a standard display, a PDA with a 4 inch GUI, or the like. In so doing, worksite related user selectable options 1310 may be modified depending on the display screen.

In another embodiment, the list of worksite related user selectable options 1310 may not be modified based on GUI size, but the number of allowed selections may be limited. For example, a user establishing a dashboard for a mobile phone may only be able to select one of the two worksite related user selectable options 1310 shown in FIG. 13A.

Generally, worksite related user selectable options 1310 may refer to any worksite that a user would want to receive information about. In other words, as described in more detail herein, there may be a plurality of worksites and any or all may have worksite related user selectable options 1310 available. Thus, the user may select to receive information about one worksite, all worksites, or any combination thereof. Moreover, for each selected worksite, the user may choose to receive similar information or different information.

Referring now to FIG. 13B, a block diagram of an exemplary listing of sub-level user selectable items 1360 for defining a GUI dashboard is shown in accordance with one embodiment of the present invention. In one embodiment, the selectable options level 111360 is based on the initial selection of assets 1324. Although the selectable options level 111360 are focused on assets 1324 this is exemplary. That is, the present technology is well suited to providing a second level of information based on any or all of the worksite related user selectable options 1310.

In one embodiment, assets 1324 has a plurality of sub-levels for use by a municipal water district including sewers 1361, fire hydrants 1362, and water meters 1363. Upon selecting one of the assets categories shown in FIG. 13B, a user can utilize a succession of sub-menus to identify a particular asset and record GIS data about it.

Although a plurality of sub-levels is provided herein, they are exemplary. That is, the present technology is well suited to more or fewer sub-levels. Moreover, the present technology is well suited to different sub-levels than those provided herein. The use of the provided sub-levels herein is merely for purposes of brevity and clarity.

Furthermore, the number of sub-level options may be provided or limited based on the size of the GUI that will be displaying the information. For example, a user may initially be defining a dashboard for a handheld device such as mobile electronic device 110 of FIG. 1. As such, the user would input the device type as part of the user input. For example, the user may submit that the dashboard profile will be based on a mobile phone with a standard display, a PDA with a 4 inch GUI, or the like. In so doing, the second level options related to equipment 1360 may be modified depending on the display screen.

In another embodiment, the list of second level options related to equipment 1360 may not be modified, but the number of allowed selections may be limited. For example, a user establishing a dashboard for a mobile phone may only be able to select one of the two second level options related to assets 1360.

With reference now to FIG. 14A, a block diagram of an exemplary top level user-defined GUI dashboard 1400 is shown in accordance with one embodiment of the present invention. In one embodiment, GUI dashboard 1400 includes a first worksite 1410A and a second worksite 1410B. Moreover, at GUI dashboard 1400 the user has selected to monitor equipment 1411 and markers 1412 for each worksite. Although, in one embodiment, the selections for each worksite are the same, the present technology is well suited to monitoring different aspects of each separate worksite. That is, the illustration of the same selections for each worksite are provided herein merely for purposes of brevity and clarity.

In one embodiment, the number of worksites that are shown on GUI dashboard 1400 is both user selectable and limited to the present GUI size. It is noted that the user may be the actual operator of mobile electronic device 110, or the administrator of GIS data network 140. Moreover, if more than two worksites were selected, the present technology may allow a user to select the order of the worksites to be displayed and may then rotate the worksites based on the user selected order. For example, if five worksites were selected to be monitored and the GUI was able to only show two at a time, then the worksites may be rotated across the screen, either automatically or when prompted, in the user defined order. In another embodiment, the additional worksites may be available via scroll bars, hot keys, or the like.

Referring now to FIG. 14B, a block diagram of an exemplary second level user-defined GUI dashboard 1440 is shown in accordance with one embodiment of the present invention. In one embodiment, second level user-defined GUI dashboard 1440 provides information regarding assets 1450 from worksite 1400A. Moreover, at second level user-defined GUI dashboard 1440 the user has elected to monitor, location 1460 and status 1470 for assets 1450. As shown in FIG. 14B, the user of mobile electronic device 110 has identified a grader 1450A, and recorded its location using GIS data collector application 111 of FIG. 1. Additionally, the user or mobile electronic device 110 has noted that the grader 1450A has a flat tire in status category 1470A. Furthermore, the user of mobile electronic device 110 has identified a dozer 1450B, recorded its location, and entered that it is due for maintenance in its respective monitored categories.

In one embodiment, the number of equipment sub-options that are shown on second level user-defined GUI dashboard 1440 is both user selectable and limited to the present GUI size. Moreover, if more than three columns of sub-options were selected, the present technology may allow a user to select the order of the sub-options to be displayed and may then rotate the sub-options based on the user selected order. For example, if five sub-options were selected to be monitored and the GUI was able to only show three at a time, then the sub-options may be rotated across the screen, either automatically or when prompted, in the user defined order. In another embodiment, the additional sub-options may be available via scroll bars, hot keys or the like.

Thus, embodiments of the present invention utilize pre-defined user selectable criteria 1300 to select portions of the displayed information from at least one reporting source. However, the displayed information may be selected from a variety of sources, such as the data recorded by a plurality of mobile electronic devices 110. For example, once the user selectable criteria 1300 has been defined, only the information selected by the user will be provided.

Furthermore, embodiments of the present invention facilitate generating a tailored asset information report 1400, wherein the tailored report 1400 comprises the pre-defined portions of the information about the asset. For example, in one embodiment, the tailored report 1400 may include a first level of detail in the formatting of the tailored report 1400. Furthermore, a user can also pre-define a second level of detail in the formatting of the tailored report 1400. In other words, the first level of detail may be an overview such as the overview shown in GUI 1400 of FIG. 14A, while the second level of detail may be a drill down of a specific portion of the first level of detail as shown in GUI 1440 of FIG. 14B.

Moreover, the second level of detail may be defined and available for any or all of the information within the first level of detail overview. For example, a user may monitor the first level of detail, e.g., GUI 1400, and then may select one of the overview sections, e.g., assets 1450 of FIG. 14B, to view in more detail.

Embodiments of the present invention also facilitate configuring a layout of the tailored asset information report 1400 based on a GUI such as GUI 1210 of FIG. 12. In one embodiment, the layout of the tailored report 1400 is configured based on a display size of the GUI 1210. Moreover, a job identifier is assigned to the configuring of the layout of the tailored asset information report 1400.

For example, the administrator of GIS data network 140 may wish to view a pre-defined version of any or all worksites in which the company is involved. In one embodiment, the administrator of GIS data network 140 will select the format of the pre-defined version utilizing a method such as user-selectable fields in a setup menu, collaborating with a technician, or the like. For example, the pre-defined version may be a high level overview of any or all of the worksites and may include the worksite name, the worksite status, the worksite actual cost versus budget, or the like.

In addition, the administrator of GIS data network 140 may establish a plurality of pre-defined versions based on a disparity of GUI's that will be viewed. For example, when accessing the information on a portable computing system, such as a laptop computer, the first pre-defined version may include a large number or even all of the worksites related to the company. However, when accessing the information from a handheld device, such as a mobile phone, personal digital assistant, or other reduced screen size device, the second pre-defined version may provide the worksites in a rotating order, utilize scroll type functionality, monitor a lesser number of worksites, reduce the variables shown per worksite, and the like. In so doing, the user will receive the desired pre-defined information in an easily readable and navigable format based on the user defined preferences and the GUI characteristics of the device receiving the information.

In a different embodiment, a worksite manager may wish to view, e.g., on a GUI 1210 or the like, a pre-defined version of any or all of the worksites in which the manager is involved. In one embodiment, the worksite manager will establish the pre-defined version by a method such as user-chosen fields in a setup menu, collaborating with a technician, or the like. For example, the pre-defined version may be a high level overview of any or all of the worksites in which the manager is involved. The pre-defined version may include the worksite name, the worksite status, the worksite actual cost versus budget, or the like. In one embodiment, the worksite manager may establish a plurality of pre-defined versions based on a disparity of GUI's or devices that will be viewed in a manner similar to that described herein.

In addition, the worksite manager may establish a plurality of pre-defined drill down versions of the asset report. For example, the worksite manager may have an initial pre-defined version that provides the worksite name, status and manpower. The worksite manager may then establish a pre-defined version of each of the initial fields, such that a selection of one of the fields, e.g., manpower, provides a pre-defined version of any or all of the data related to manpower. For example, number of injuries, safety record, personnel at work, personnel not at work or the like.

In one embodiment, the number of user pre-defined levels is limited only by the data in the database and the desire of the user. For example, the administrator of GIS data network 140 may pre-define the drill down features to range from an overview of worksites to the maintenance schedule of a particular truck. In so doing, the pre-defined asset management version may initially provide an entire company-worksite overview when accessed but also allow the user to delve into any pre-defined details.

Moreover, because the asset management information is pre-defined, if a particular aspect of a particular worksite becomes a point of focus, the administrator of GIS data network 140, may re-define the initial top level GUI asset monitoring information to include details about the particular aspect of the particular worksite without requiring the user to delve at all. That is, the user is capable of defining what information is displayed at what level and what detail is provided within the information, per display being utilized. Conveniently, this is available without requiring a user to navigate through superfluous data, search a crowded report, navigate with an undersized display, and the like.

In one embodiment, when the layout of the tailored asset information report 1400 is larger than the display size of the GUI 1210, a user selectable order of rotation may be defined for the layout of the asset information within the report. For example, a first portion of the layout of the tailored asset information report 1400 will be initially shown on the GUI 1210. Then, either after a period of time, based on a user input, or any other criteria, the first portion of the layout of the tailored asset information report 1400 will be removed and a second portion of the layout of the tailored asset information report 1400 will then be shown on the GUI 1210. This rotation of pages can continue for any number of layout pages. Moreover, the rotation could be reversed, shuffled, hot keyed, or the like to allow a user to define the order in which the pages are viewed, modify the order in which the pages are viewed, or skip from one page to a specific other page regardless of any pre-designated page order.

In another embodiment, when the layout of the tailored asset information report 1400 is larger than the display size of the GUI 1210, a layout navigator is provided as a portion of the layout of the tailored asset information report 1400. For example, the layout navigator may be a scroll bar, a set of scroll bars, arrows, or any other type of receivable input that will allow a user to navigate a larger document layout with a window that is smaller than the size of the document layout being presented. In other words, if the layout is a virtual size of 10"×10" and the screen size is 5", then at any given time only a portion of the layout would be produced on the GUI 1210. However, the utilization of the layout navigator allows a user to modify which portion of the layout of the tailored asset information report 1400 is viewable on the GUI 1210. That is, the user is able to use the layout navigator to navigate within the virtual size of 10"×10" when the screen size is 5".

In addition to allowing a user to configure a first layout of the tailored asset information report 1400 based on a first display size of a GUI, the present technology also allows a user to configure a second layout of the tailored asset information report 1440, having at least one level of detail, based on a display size of a second GUI. For example, the user may configure a first tailored asset information report 1400 based on a first device, such as a laptop computer, having a diagonal screen size of 17". In addition, the user may configure a second tailored asset information report 1440 based on second device, such as a cellular telephone, having a screen size 128×128 pixels. Moreover, the user may assign a first job identifier to the first layout configuration and a second job identifier to the second layout configuration of the tailored asset information report 1440. Therefore, when the user prepares to access the information, the user may input the job identifier to receive the report configured to the device being utilized.

For example, if the user is utilizing the notebook, the user would access the Internet or another network to establish a connection with the asset management system providing the asset report. If required, the user may then login and provide a password to establish his identity with the asset management system. The user would then input the first job identifier. The asset management system would then provide the pre-defined layout which was configured to a 17" GUI. In one embodiment, the first layout may include many details because of the amount of room available for displaying information. However, if the user was utilizing mobile electronic device 110, the user would input the second job identifier and the received layout would be configured to a 128×128 pixel display. Thus, in one embodiment, the second layout may not include as many details as the first layout, may monitor a fewer number of aspects than the first layout, may require a user to navigate through the layout, may require a number of pages to be scrolled through or the like. In other words, the user could specify that the second layout be reduced in information, or could specify that the information remain the same and design the method for navigating around within the layout.

Thus, embodiments of the present invention provide methods and systems for delivering formatted information to a device. Embodiments further provide methods and systems for delivering formatted information to a device which is selected based upon user predefined criteria. Embodiments further provide methods and systems for delivering information to a device wherein the information delivered is tailored based on the device GUI. These methods and systems provide further tools for a company or person to efficiently and conveniently monitor aspects of company operation including assets that are being operated.

An embodiment of the present invention, a method and system for creating a flexible GIS data collection network, is thus described. While the present invention has been described in particular embodiments, it should be appreciated that the present invention should not be construed as limited by such embodiments, but rather construed according to the following claims.

What is claimed is:

1. A method for creating a flexible Geographic Information Systems (GIS) network, said method comprising:

assigning a data dictionary comprising a definition of at least one desired GIS feature type to a mobile electronic device configured to determine its geographic position using an integral Global Navigation Satellite System (GNSS) device and wherein said definition of said desired GIS feature type was not originally intended to be recordable by said mobile electronic device;

determining that said data dictionary is not yet resident upon said mobile electronic device:

automatically uploading said data dictionary onto said mobile electronic device using a wireless network;

forwarding collected GIS data in real-time from said mobile electronic device wherein a GIS data collector application initiates automatically sending the collected GIS data via said wireless network in response to an indication to save the collected GIS data on said mobile electronic device;

storing the collected GIS data on a data storage device of a storage and forwarding system; and automatically deleting the collected GIS data from said mobile electronic device in response to a confirmation message from said storage and forwarding system.

2. The method as recited in claim 1 further comprising:
conveying a request for said desired GIS feature type using said mobile electronic device.

3. The method as recited in claim 2 further comprising:
using a wireless communication network to convey said request and to upload said data dictionary.

4. The method as recited in claim 1 further comprising:
uploading a GIS data collector application onto said mobile electronic device for enabling said mobile electronic device to perform GIS data collection functions.

5. The method as recited in claim 1 further comprising:
automatically generating a message to a recipient of said collected GIS data in response to said storing the collected GIS data;
sending said collected GIS data to said recipient in response to a message therefrom; and
receiving a confirmation from said recipient that said collected GIS data has been received.

6. The method as recited in claim 1 wherein said deleting further comprises:
automatically deleting the collected GIS data from said mobile electronic device in response to said confirmation message.

7. The method as recited in claim 1 further comprising:
determining that communications via said wireless communication network are not established;
storing the collected GIS data on said mobile electronic device;
establishing wireless communications with a storage and forwarding server via a wireless communication network; and
initiating said forwarding in response to said establishing.

8. The method as recited in claim 1 further comprising:
uploading said data dictionary onto a dedicated GIS data collector.

9. The method as recited in claim 1 further comprising:
uploading said data dictionary onto a mobile electronic device selected from the group consisting of a legacy cellular telephone, a legacy personal digital assistant (PDA), and a legacy mobile computer system.

10. The method as recited in claim 1 further comprising:
formatting said data dictionary in a pre-defined manner which is selected based upon said mobile electronic device.

11. The method as recited in claim 10 further comprising:
formatting said data dictionary based upon the display capabilities of said mobile electronic device.

12. A storage and forwarding system configured to facilitate the creation of a flexible Geographic Information Systems (GIS) network, said storage and forwarding system comprising:
a data dictionary verifier for determining which version of a data dictionary is resident upon a mobile electronic device and wherein said data dictionary comprises at least one feature type which was not originally intended for use by said mobile electronic device; and
a data dictionary forwarder for sending a second data dictionary comprising a definition of at least one desired GIS feature type to said mobile electronic device using a wireless network and wherein said definition of said at least one desired GIS feature type was not originally intended to be recordable by said mobile electronic device, said data dictionary verifier is further for automatically initiating the updating said data dictionary if said second data dictionary has been identified for said mobile electronic device, said mobile electronic device comprising a data collector application which configures said mobile electronic device to perform GIS data collector functions wherein collected GIS data is automatically forwarded in real-time from said mobile electronic device to said storage and forwarding system via said wireless network in response to an indication to save the collected GIS data on said mobile electronic device and wherein the collected GIS data is automatically deleted from said mobile electronic device in response to a confirmation message from said storage and forwarding system.

13. The system of claim 12 wherein said mobile electronic device comprises a legacy mobile electronic device selected from the group consisting of a legacy cellular telephone, a legacy personal digital assistant (PDA), and a legacy mobile computer system.

14. The system of claim 12 wherein said data collector application automatically deletes the recorded GIS data in response to said confirmation message from said storage and forwarding server.

15. The system of claim 12 wherein said storage and forwarding system further comprises:
a feature inserter for forwarding GIS data recorded by said mobile electronic device to a GIS data network.

16. The system of claim 12 further comprising:
a management application configured to select said at least one desired GIS feature type in response to a request conveyed by said mobile electronic device.

17. The system of claim 12 wherein said storage and forwarding system deletes said GIS data in response to a confirmation message generated by said GIS data network.

18. The system of claim 12 wherein said data dictionary forwarder is further for formatting said data dictionary in a pre-defined manner which is selected based upon said mobile electronic device.

19. The system claim 18 wherein said data dictionary forwarder formats said data dictionary based upon the display capabilities of said mobile electronic device.

20. The system of claim 12 further comprising:
a data collector application forwarder for determining whether a data collector application resident upon said mobile electronic device is a current version and for conveying said current version to a mobile electronic device.

21. The system of claim 12 further comprising:
a data dictionary feature selector for creating a second data dictionary wherein at least one desired GIS feature type is selected from a superset of feature types based upon an assigned membership of said mobile electronic device to a workgroup.

22. A method for creating a flexible Geographic Information Systems (GIS) network, said method comprising:
determining an assigned membership of a mobile electronic device to a workgroup, said mobile electronic device comprising a GIS data collector application which configures said mobile electronic device to perform GIS data collector functions wherein collected GIS data is automatically forwarded in real-time from said mobile electronic device to a storage and forwarding system via a wireless network in response to an indication to save the collected GIS data on said mobile electronic device and wherein the collected GIS data is automatically deleted from said mobile electronic device in response to a confirmation message from said storage and forwarding system;

determining that a first data dictionary resident upon said mobile electronic device does not comprise a definition of at least one desired GIS feature type, and wherein said first data dictionary is selected based upon said workgroup;

receiving a request for a second data dictionary comprising said definition of said at least one desired GIS feature type which was not originally intended for said workgroup;

determining that said second data dictionary is not yet resident upon said mobile electronic device; and automatically sending said second data dictionary to said mobile electronic device.

23. The method as recited in claim 22 further comprising:
establishing communications with said mobile electronic device via a wireless network; and
automatically sending said second data dictionary to said mobile electronic device via said wireless network.

24. The method as recited in claim 22 further comprising:
receiving a modification of said first data dictionary for said workgroup to create said second data dictionary; and
automatically sending said second data dictionary to said mobile electronic device when communications are established therewith via said wireless network.

25. The method as recited in claim 22 further comprising:
conveying a request for said desired GIS feature type using said mobile electronic device.

26. The method as recited in claim 22 further comprising:
generating a confirmation message to said mobile electronic device wherein said GIS data collector application deletes the collected GIS data in response to said confirmation message.

27. The method as recited in claim 22 further comprising:
automatically generating a message to a recipient of the collected GIS data in response to said storing the collected GIS data.

28. The method as recited in claim 27 further comprising:
sending said collected GIS data to said recipient in response to a message therefrom;
receiving a confirmation from said recipient that said collected GIS data has been received; and
automatically deleting the collected GIS data in response to said confirmation from said recipient.

29. The method as recited in claim 22 further comprising:
utilizing a mobile electronic device selected from the group consisting of a legacy cellular telephone, a legacy personal digital assistant (PDA), and a legacy mobile computer system.

30. The method as recited in claim 22 further comprising:
formatting said data dictionary in a pre-defined manner which is selected based upon said mobile electronic device.

31. The method as recited in claim 30 further comprising:
formatting said data dictionary based upon the display capabilities of said mobile electronic device.

* * * * *